United States Patent
Ochiai et al.

(10) Patent No.: US 10,026,888 B2
(45) Date of Patent: Jul. 17, 2018

(54) MAGNETORESISTIVE EFFECT ELEMENT AND MAGNETIC MEMORY

(71) Applicant: TOSHIBA MEMORY CORPORATION, Minato-ku, Tokyo (JP)

(72) Inventors: Takao Ochiai, Funabashi Chiba (JP); Eiji Kitagawa, Yokohama Kanagawa (JP); Kenji Noma, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 14/639,430

(22) Filed: Mar. 5, 2015

(65) Prior Publication Data

US 2016/0043305 A1 Feb. 11, 2016

Related U.S. Application Data

(60) Provisional application No. 62/034,038, filed on Aug. 6, 2014.

(51) Int. Cl.
*H01L 29/82* (2006.01)
*H01L 43/08* (2006.01)
(Continued)

(52) U.S. Cl.
CPC ............. *H01L 43/08* (2013.01); *H01L 43/10* (2013.01); *H01L 27/228* (2013.01)

(58) Field of Classification Search
CPC . H01L 43/08; H01L 27/222; H01L 29/66984; H01L 43/10
See application file for complete search history.

(56) References Cited

U.S. PATENT DOCUMENTS

| 6,600,184 B1* | 7/2003 | Gill ................... B82Y 10/00 257/25 |
| 6,937,497 B1* | 8/2005 | Ju ..................... G11C 11/16 365/130 |

(Continued)

FOREIGN PATENT DOCUMENTS

| CN | 103490006 A * | 1/2014 | ............. H01L 43/08 |
| JP | 2010-021580 | 1/2010 | |

(Continued)

OTHER PUBLICATIONS

Ikeda, S., et al., "Tunnel magnetoresistance of 604% at 300 K by suppression of Ta diffusion in Co Fe B/Mg O/Co Fe B pseudo-spin-valves annealed at high temperature". Applied Physics Letters 93, 082508, 2008.

(Continued)

*Primary Examiner* — Khiem D Nguyen
(74) *Attorney, Agent, or Firm* — Holtz, Holtz & Volek PC

(57) ABSTRACT

According to one embodiment, a magnetoresistive effect element includes: a first magnetic layer; a second magnetic layer; a non-magnetic film between the first magnetic layer and the second magnetic layer; a first layer on an opposite side of a side of the non-magnetic layer of the first magnetic layer, the first layer including magnesium oxide as a principal component; and a second layer between the first film and the first magnetic layer, the second layer including a material different from a material of the first layer.

12 Claims, 14 Drawing Sheets

(51) Int. Cl.
*H01L 43/10* (2006.01)
*H01L 27/22* (2006.01)

(56) References Cited

U.S. PATENT DOCUMENTS

| | | | | |
|---|---|---|---|---|
| 8,710,603 B2* | 4/2014 | Jan | ............ | H01L 43/08 257/421 |
| 2005/0105325 A1* | 5/2005 | Haneda | ............ | G11C 11/15 365/154 |
| 2005/0219767 A1* | 10/2005 | Nakamura | ............ | H01L 43/08 360/324.1 |
| 2007/0086121 A1* | 4/2007 | Nagase | ............ | B82Y 25/00 360/324.1 |
| 2010/0258887 A1* | 10/2010 | Zhu | ............ | H01L 27/228 257/421 |
| 2011/0305078 A1* | 12/2011 | Ranjan | ............ | G11C 11/16 365/171 |
| 2012/0018823 A1* | 1/2012 | Huai | ............ | B82Y 25/00 257/421 |
| 2012/0068283 A1 | 3/2012 | Hosotani | | |
| 2012/0241881 A1 | 9/2012 | Daibou et al. | | |
| 2013/0334631 A1* | 12/2013 | Kinney | ............ | H01L 43/08 257/421 |
| 2014/0264673 A1* | 9/2014 | Kitagawa | ............ | H01L 43/10 257/421 |
| 2015/0162525 A1* | 6/2015 | Park | ............ | H01L 43/08 257/421 |

FOREIGN PATENT DOCUMENTS

| | | |
|---|---|---|
| JP | 2012-069671 | 4/2012 |
| JP | 2012-204683 | 10/2012 |
| JP | 2013-041961 | 2/2013 |

OTHER PUBLICATIONS

Sato, H., et al., "MgO/CoFeB/Ta/CoFeB/MgO recording structure with low intrinsic critical current and high thermal stability". Journal of the Magnetics Society of Japan, vol. 38, No. 2-2, pp. 56-60, 2014.

Tsunoda, K., et al., "A Novel MTJ for STT-MRAM with a Dummy Free Kayer and Dual Tunnel Junctions". Low-power Electronics Association and Project (LEAP), IEDM12, pp. 665-668, 2012.

Lee, Y.M., et al., "Effect of electrode composition on the tunnel magnetoresistance of pseudo-spin-valve magnetic tunnel junction with a MgO tunnel barrier," Applied Physics Letters,.2007, pp. 212507-through-3, vol. 90.

* cited by examiner

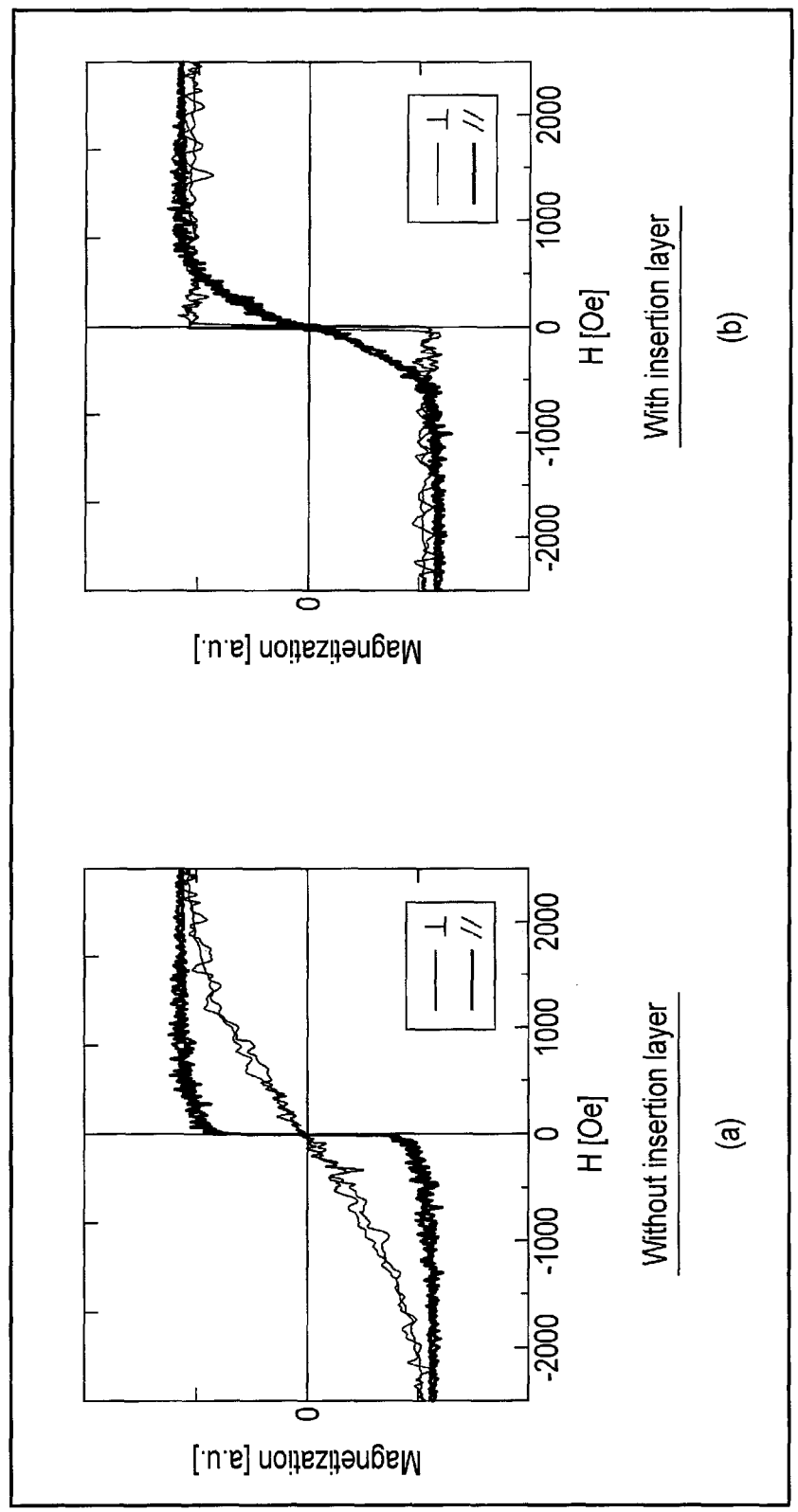
F I G. 7

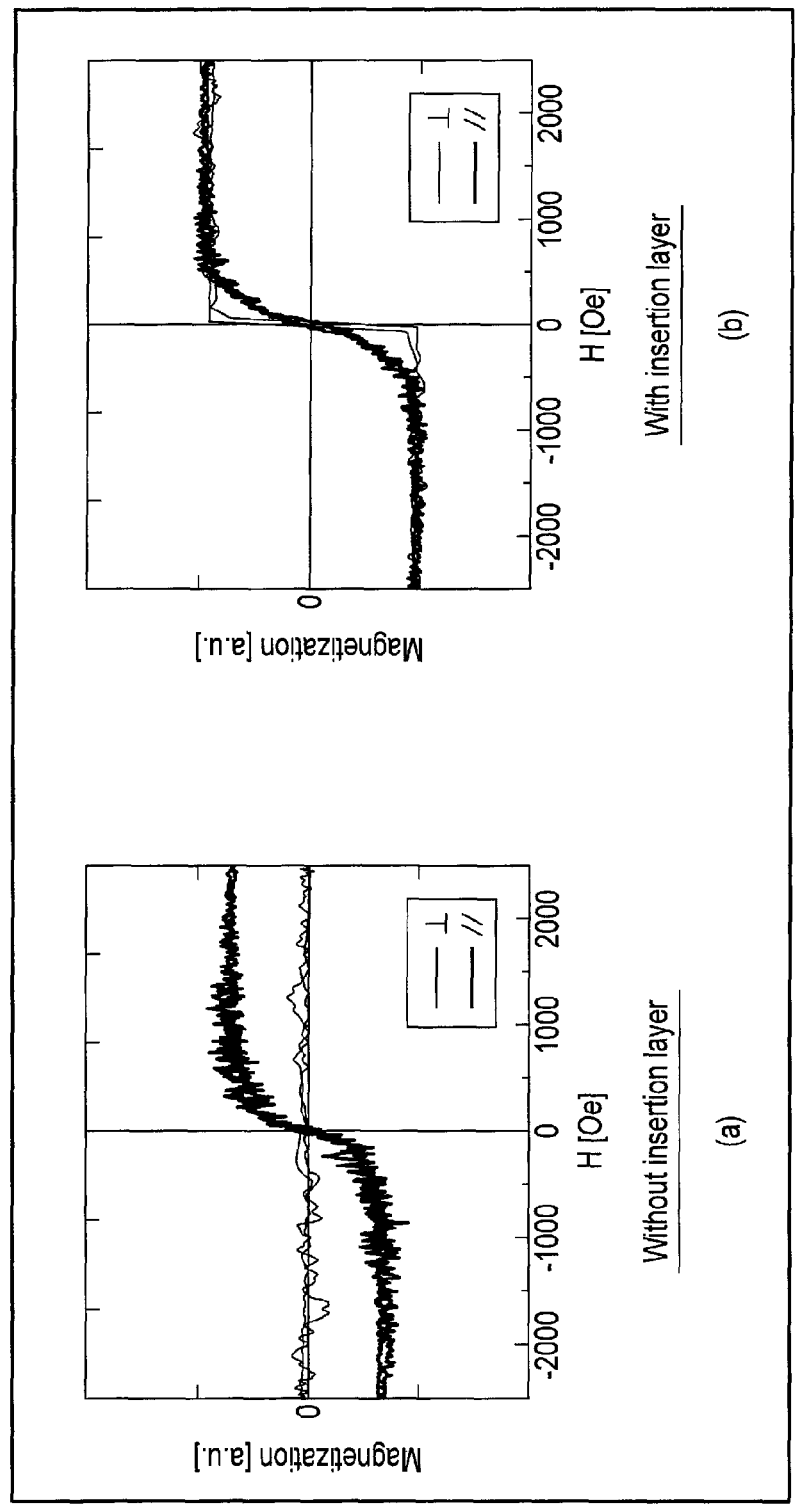
F I G. 9

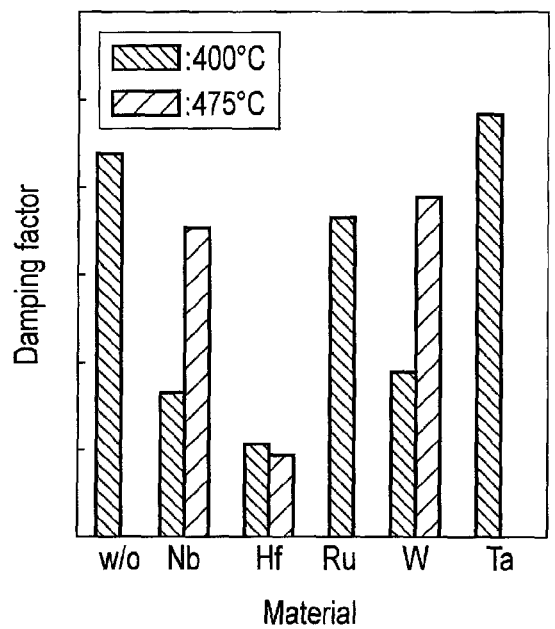
F I G. 10
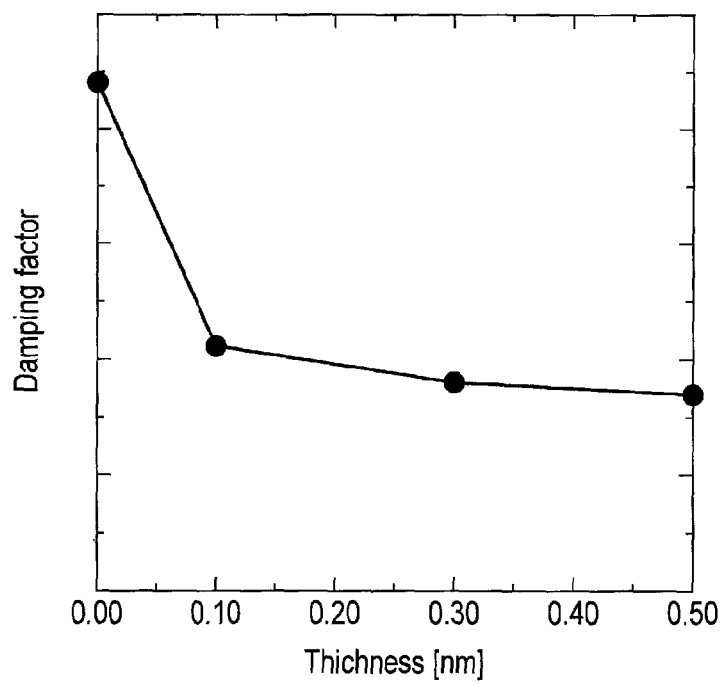
F I G. 11

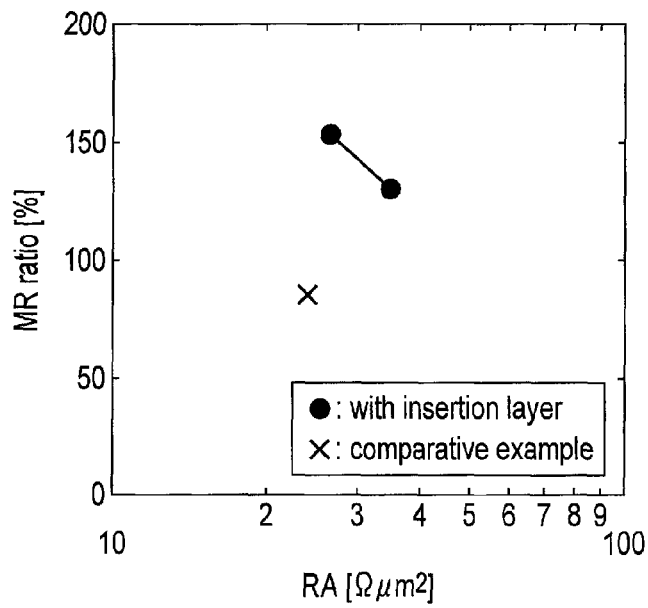
F I G. 12
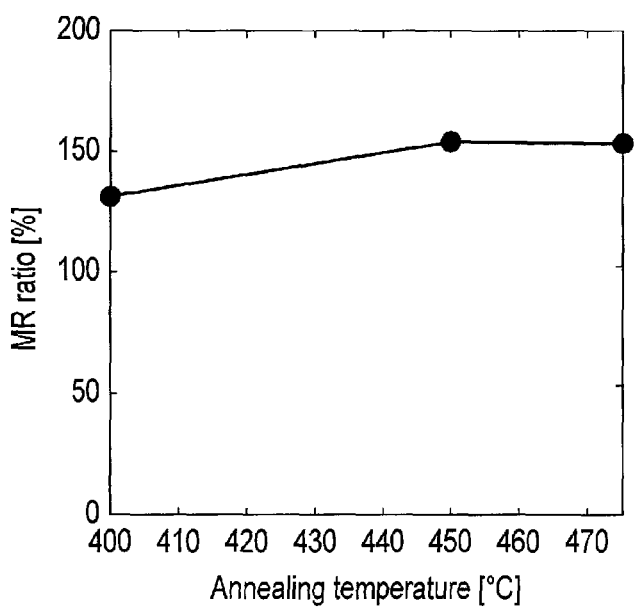
F I G. 13

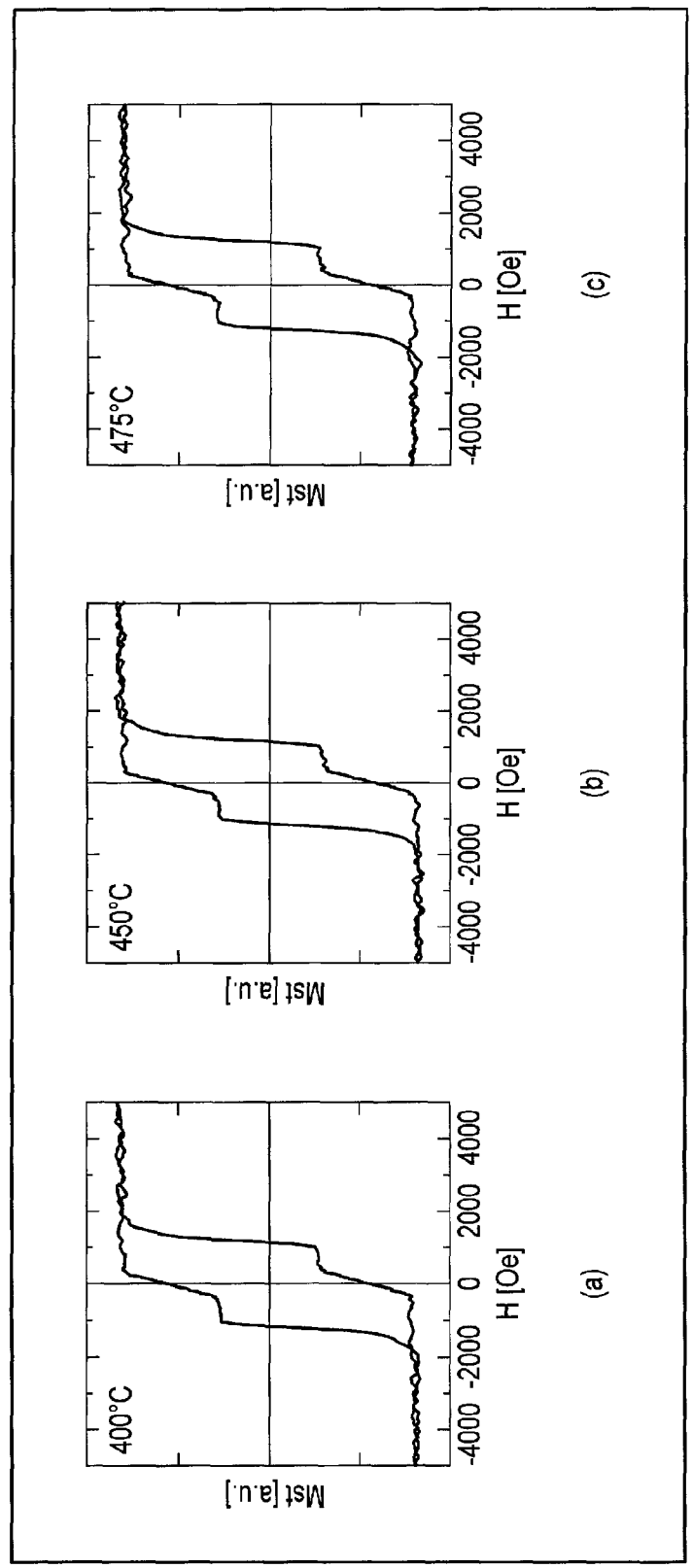
F I G. 14

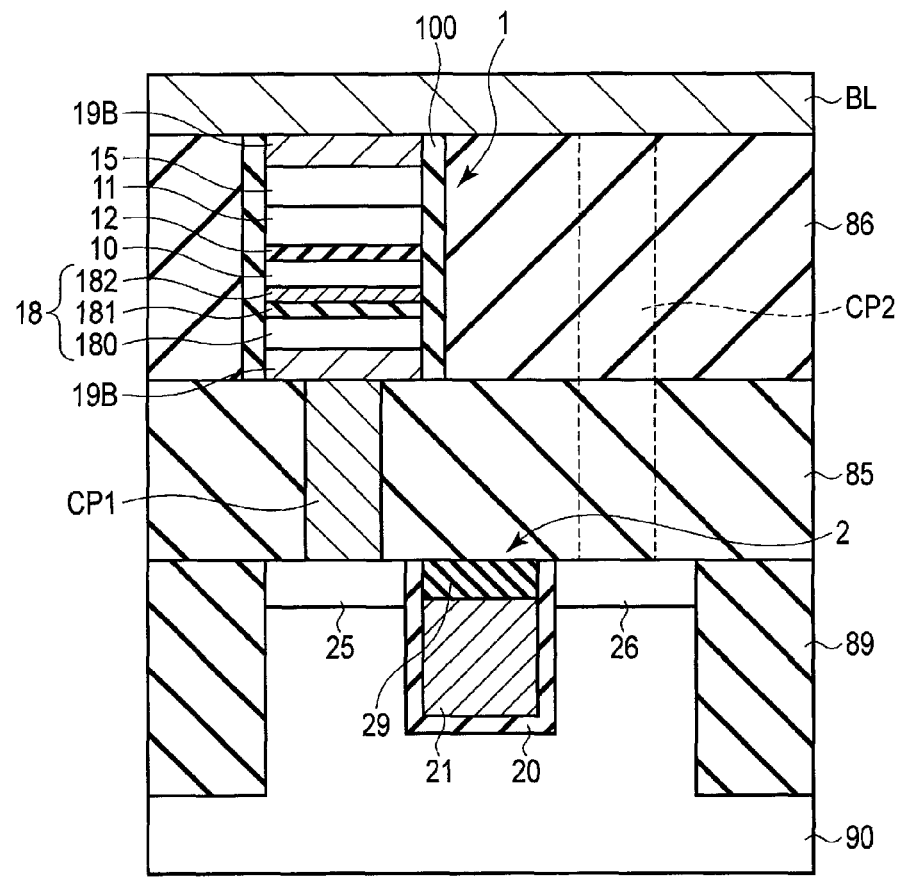
F I G. 18

MAGNETORESISTIVE EFFECT ELEMENT AND MAGNETIC MEMORY

CROSS-REFERENCE TO RELATED APPLICATIONS

This application claims the benefit of U.S. Provisional Application No. 62/034,038, filed Aug. 6, 2014, the entire contents of which are incorporated herein by reference.

FIELD

Embodiments described herein relate generally to a magnetoresistive effect element and a magnetic memory.

BACKGROUND

Various technologies have been proposed to realize a magnetic memory in which a tunnel magneto resistance (TMR) element is used as a memory element.

As one such technology, a mode in which "1" or "0" data is recorded in a magnetic tunnel junction (MTJ) element so as to correspond to a magnetization arrangement state of the MTJ element and recorded data is read based on a difference of the value of resistance of the MTJ element due to a TMR effect is known.

From the viewpoint of an increasingly finer structure and a lower current of an element, a spin transfer torque (STT) mode capable of reversing the direction of magnetization of a magnetic substance by passing a current to the magnetic substance draws attention as a write mode of data applied to a magnetic memory.

The development of a magnetic memory (for example, MRAM) in STT mode is accelerated as a memory capable of low power consumption, high-speed operation, and large capacity.

BRIEF DESCRIPTION OF THE DRAWINGS

FIG. 7 is diagram illustrating characteristics of the magnetic layer used in the magnetoresistive effect element according to the first embodiment;

FIG. 9 is diagram illustrating characteristics of the magnetic layer used in the magnetoresistive effect element according to the first embodiment;

FIG. 10 is a diagram illustrating characteristics of the magnetic layer used in the magnetoresistive effect element according to the first embodiment;

FIG. 11 is a diagram illustrating characteristics of the magnetic layer used in the magnetoresistive effect element according to the first embodiment;

FIG. 12 is a diagram illustrating characteristics of the magnetoresistive effect element according to the first embodiment;

FIG. 13 is a diagram illustrating characteristics of the magnetoresistive effect element according to the first embodiment;

FIG. 14 is diagram illustrating characteristics of the magnetoresistive effect element according to the first embodiment;

FIG. 18 is a diagram illustrating the application example of the magnetoresistive effect element according to the embodiment.

DETAILED DESCRIPTION

The embodiments will be described below in detail with reference to the drawings. In the description that follows, the same reference signs are attached to elements having the same function and configuration and a duplicate description will be provided only when necessary.

In general, according to one embodiment, a magnetoresistive effect element includes: a first magnetic layer; a second magnetic layer; a non-magnetic layer between the first magnetic layer and the second magnetic layer; a first layer on an opposite side of a side of the non-magnetic layer of the first magnetic layer, the first layer including magnesium oxide as a principal component; and a second layer between the first layer and the first magnetic layer, the second layer including a material different from a material of the first layer.

(1) First Embodiment

A magnetoresistive effect element according to the first embodiment will be described with reference to FIGS. 1 to 14.

(a) Structure

The structure of the magnetoresistive effect element according to the first embodiment will be described using FIG. 1.

Figure 1:
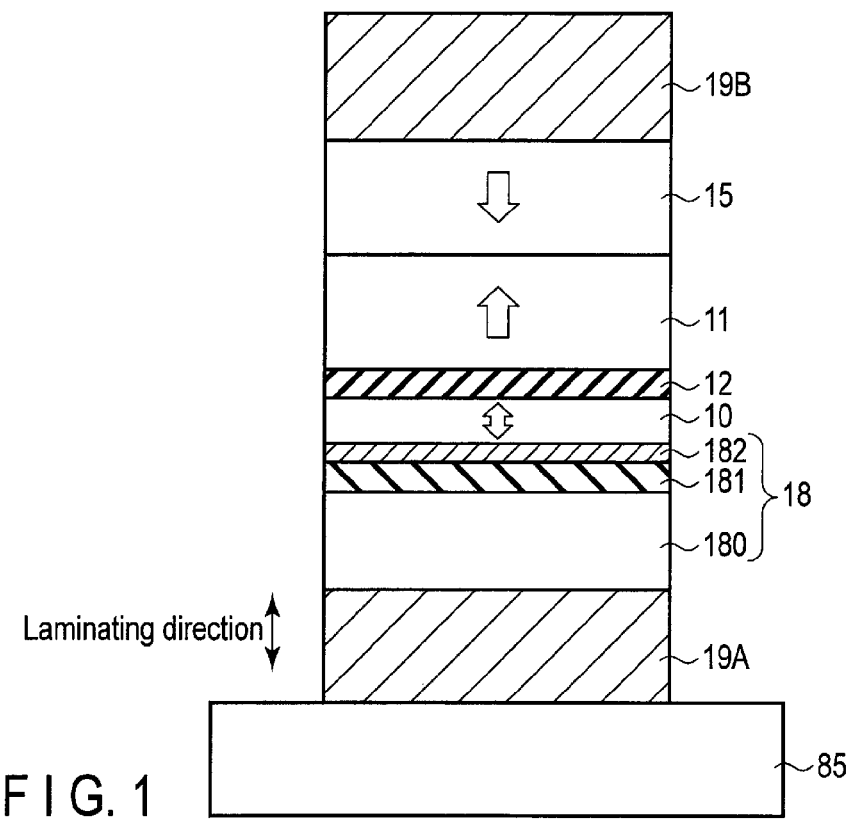
FIG. 1 is a diagram showing a configuration example of a magnetoresistive effect element according to a first embodiment.

FIG. 1 is a diagram schematically showing a section structure of the magnetoresistive effect element according to the present embodiment.

As shown in FIG. 1, a magnetoresistive effect element 1 according to the present embodiment includes at least two magnetic layers 10, 11 between two electrodes 19A, 19B of the element 1. A non-magnetic layer 12 is provided between the two magnetic layers 10, 11.

In the present embodiment, the two magnetic layers 10, 11 and the non-magnetic layer 12 form a magnetic tunnel junction (MTJ). Hereinafter, the magnetoresistive effect element 1 according to the present embodiment will be called a MTJ element 1.

Component members of the MTJ element 1 are stacked in the order of a lower electrode 19A, a foundation layer 18, the first magnetic layer 10, the non-magnetic layer 12, the second magnetic layer 11, a third magnetic layer 15, and an upper electrode 19B from a substrate side in a direction perpendicular to the surface of a substrate 85.

Hereinafter, the surface of the layer (film) on the upper electrode side in a direction perpendicular to the substrate surface will be called a top surface and the surface of the layer on the lower electrode side will be called a bottom surface (or an undersurface). In the present embodiment, a structure in which a member A is stacked on the top surface of a member B is denoted by "A/B".

The lower electrode 19A is provided on the substrate 85. It is preferable to use a material whose electric resistance is low and having superior resistance to diffusion of atoms (elements) for the lower electrode 19A.

The foundation layer 18 is provided on the lower electrode 19A. The foundation layer 18 is a layer to improve a quality and characteristics of the layer on the foundation layer 18. The foundation layer 18 has, for example, a laminated structure including a plurality of films 180, 181, 182. The foundation layer 18 may be handled as a film in the lower electrode 19A.

The first magnetic layer 10 is provided on the top surface of the foundation layer 18.

The direction of magnetization of the first magnetic layer 10 is variable. Hereinafter, the first magnetic layer 10 in which the direction of magnetization is variable is called a storage layer (or a recording layer, a free layer, or a magnetizing free layer).

The storage layer 10 is a magnetizing film having perpendicular magnetic anisotropy. The direction of magnetization of the storage layer 10 is approximately perpendicular to the layer surface (film surface) of the storage layer and is approximately parallel to the laminating direction of layers.

For example, a magnetizing film including at least two of cobalt (Co), iron (Fe), and boron (B) is used for the storage layer 10. For example, a FeCoB film is used for the storage layer 10. The FeCoB film as the storage layer 10 includes more Fe components (concentration) than Co components in the film. However, the storage layer 10 may be a film (CoFeB film) including more Co components (concentration) than Fe components in the film.

The non-magnetic layer 12 is provided on the top surface of the storage layer 10. If the magnetoresistive effect element 1 is a MTJ element, the non-magnetic layer 12 is called a tunnel barrier film. The tunnel barrier film 12 is, for example, an insulating film having magnesium oxide as the principal component. If the tunnel barrier film 12 is a magnesium oxide film (MgO film), the MgO film is preferably (001)-oriented. However, the MgO film as the tunnel barrier film 12 may be a film including fine crystal grains or an amorphous film. Alternatively, the tunnel barrier film 12 may be a MgO film to which impurities are added.

The second magnetic layer 11 is provided on the tunnel barrier film 12.

The direction of magnetization of the second magnetic layer 11 is set in a fixed state (invariable state). Hereinafter, the second magnetic layer 11 in which the direction of magnetization is in a fixed state will be called a reference layer (or a pin layer, a pinned layer, or an invariable magnetization layer).

The reference layer 11 has, like the storage layer 10, perpendicular magnetic anisotropy. A film having a ferrimagnetic substance as the principal component, for example, a TbCoFe film is used for the reference layer 11. A Co—Cr alloy, a Fe—Pt ordered alloy, a Fe—Pd ordered alloy, a Co—Pt ordered alloy, a Fe—Co—Pt ordered alloy, a Fe—Ni—Pt ordered alloy, a Fe—Ni—Pd ordered alloy, or an artificial lattice structure in which Co of a magnetic substance and Pt (or Pd) of a non-magnetic substance are alternately stacked may be used for the reference layer 11. Alternatively, the reference layer 11 may be formed from the same material as that of the storage layer 10.

The third magnetic layer 15 is provided on the top surface of the reference layer 11.

The direction of magnetization of the third magnetic layer 15 is in a fixed state. The third magnetic layer 15 has magnetization in an opposite direction of the direction of magnetization of the reference layer 11. The third magnetic layer 15 is a layer to reduce a stray field caused by the reference layer 11 to substantially zero and inhibits a shifting field caused by a stray field from the reference layer 11 from arising in the storage layer 10. Hereinafter, the third magnetic layer 15 will be called a shift adjustment layer (or a bias layer or a shifting field adjustment layer).

The same material can be used for the shift adjustment layer 15 as that used for the reference layer 11. For example, a metal film (not shown) may be provided between the shift adjustment layer 15 and the reference layer 11.

The upper electrode 19B is provided on the top surface of the shift adjustment layer 15. The same material as that used for the lower electrode 19A can be used for the upper electrode 19B. The upper electrode 19B can be used as a hard mask to process the MTJ element 1 into a predetermined shape.

Incidentally, an interface layer (not shown) may be provided near the interface between the storage layer 10 and the tunnel barrier film 12. The interface layer is a magnetic layer in direct contact with the tunnel barrier film 12. A portion (area) of the storage layer 10 in contact with the tunnel barrier film 12 may be called the interface layer. The interface layer may be provided between the reference layer 11 and the tunnel barrier film 12. The storage layer 10 and the reference layer 11 may have a laminated structure of a plurality of magnetic films.

Each layer included in the MTJ element 1 is successively deposited on the substrate 85 by the sputtering method or the ALD method. A laminated structure including a plurality of deposited layers is processed into a predetermined shape by using photolithography and etching (for example, ion milling). Accordingly, the MTJ element 1 according to the present embodiment is formed. Before or after etching of the laminated structure, various processes such as annealing (heat treatment) are performed on the laminated structure (MTJ element).

When the MTJ element 1 is used as a memory element of a magnetic memory, data is written into the MTJ element 1 as a memory element by, for example, spin transfer torque (STT). A write current (magnetization reversal current) is supplied into the MTJ element 1 to reverse the direction of magnetization of the storage layer 10. The write current has a current value equal to or larger than a magnetization reversal threshold of the storage layer 10 and also a current value equal to or less than a magnetization reversal threshold of the reference layer 11.

"The direction of magnetization of the reference layer is in a fixed state" or "the direction of magnetization of the reference layer is invariable" means that the direction of magnetization of the reference layer 11 does not change when a current equal to or larger than a magnetization reversal threshold to reverse the direction of magnetization of the storage layer 10 is passed to the reference layer 11.

The magnetization reversal threshold of the reference layer 11 is made larger than that of the storage layer 10 by making the thickness of the reference layer 11 larger than that of the storage layer 10.

When data is written into the MTJ element 1 by using STT, a write current flowing bidirectionally with respect to the MTJ element 1 is supplied to the MTJ element 1.

When the direction of magnetization of the storage layer 10 is parallel (P state) to that of magnetization of the reference layer 11, a write current flowing from the storage layer 10 to the reference layer 11 is supplied to the MTJ element 1. In this case, the spin angular momentum (spin torque) of spin polarized electrons having the same direction as that of the magnetization (spin) of the reference layer 11 is applied to the magnetization (spin) of the storage layer 10 and the magnetization of the storage layer 10 is reversed to be the same direction as that of magnetization of the reference layer 11. When the arrangement of magnetization of the MTJ element 1 is the parallel arrangement (parallel state), the value of resistance of the MTJ element 1 is the smallest.

When the direction of magnetization of the storage layer 10 is anti-parallel (AP state) to that of the magnetization of the reference layer 11, a write current flowing from the reference layer 11 to the storage layer 10 is supplied to the MTJ element 1. In this case, electrons having a spin anti-parallel to the direction of magnetization of the reference layer 11 are reflected by the reference layer 11. The spin torque of reflected spin polarized electrons is applied to the magnetization of the storage layer 10 and the magnetization of the storage layer 10 is reversed to be the opposite direction of the direction of magnetization of the reference layer 11. When the arrangement of magnetization of the MTJ element 1 is the anti-parallel arrangement (anti-parallel state), the value of resistance of the MTJ element 1 is the largest.

When the MTJ element 1 is used for a memory element of a magnetic memory, for example, the MTJ element 1 in a state of low resistance (the arrangement of magnetization is parallel) is associated with a "0" data holding state and the MTJ element 1 in a state of high resistance (the arrangement of magnetization is anti-parallel) is associated with a "1" data holding state.

When the resistance state of the MTJ element 1 according to the present embodiment is determined, whether the MTJ element 1 as a memory element is in a "0" data holding state or a "1" data holding state is determined by passing a current into the MTJ element 1. A read current (resistance determination current) is supplied to the MTJ element 1 to determine the resistance state of the MTJ element 1. The magnitude of an output signal (read output, a read signal) from the MTJ element based on the read current varies in accordance with the value of resistance of the MTJ element 1. Variations of the read signal are detected and amplified to determine a data holding state of the MTJ element 1 as a memory element.

In this manner, data stored in the MTJ element as a memory element is read. The current value of the read current is set to a value smaller than the current value (magnetization reversal threshold) of the write current so that the magnetization of the storage layer 10 is not reversed by the read current.

In the MTJ element 1 according to the present embodiment, the foundation layer 18 includes a Mg oxide film (for example, a MgO film) 181 and an insertion film 182 on the top surface of the Mg oxide film 181.

The MgO film (hereinafter, also referred to as a foundation MgO film) 181 in the foundation layer 18 is a layer (in the present embodiment, also referred to as an upper film or a foundation film) to improve crystallinity and magnetic properties of the storage layer 10. The foundation MgO film (foundation MgO layer) 181 is preferably a (001)-oriented crystalline film (for example, a polycrystalline film).

Due to magnetocrystalline anisotropy and interfacial magnetic anisotropy of the FeCoB film originating from the foundation MgO film, the magnetic anisotropy of the FeCoB film 10 is more likely to be perpendicular. The foundation MgO film 181 may be a film including fine crystal grains or an amorphous film.

The foundation MgO film 181 may be, for example, a tunnel insulating film. The value of resistance of the foundation MgO film 181 is preferably equal to or less than the value of resistance of the tunnel barrier film 12.

The insertion film (the insertion layer) 182 is provided between the storage layer 10 and the MgO film 181. The top surface of the insertion film 182 is in direct contact with, for example, the bottom surface of the storage layer 10. The bottom surface of the insertion film 182 is in direct contact with the MgO film 181.

The insertion film 182 is a film having electric conductivity. The insertion film 182 is, for example, a metal film.

The insertion film 182 includes at least one metal film selected from a group including niobium (Nb), ruthenium (Ru), hafnium (Hf), tantalum (Ta), and tungsten (W). However, the insertion film 182 may be an alloy film including at least one element selected from a group including Nb, Ru, Hf, Ta, and W as a principal component. However, the insertion film 182 may be a conductive compound film including at least one element selected from a group including Nb, Ru, Hf, Ta, and W as a principal component.

The insertion film 182 functions as a buffer film between the foundation MgO film 181 and the magnetic layer 10.

The surface smoothness (surface flatness) of the insertion film 182 is higher than that of the foundation MgO film 181.

For example, the foundation layer 18 includes a lower film 180 between the foundation MgO film 181 and a lower electrode 18A. The lower film 180 includes at least one film. A nitride film (for example, an aluminum nitride film), a boride film (for example, a hafnium boride film), or a laminated film including at least one of a nitride film and boride film is used for the lower film 180. Characteristics of the magnetic layer 10 on the foundation layer 18 and characteristics of the MTJ element 1 are improved by the lower film 180. However, the foundation layer 18 may not include the lower film 180.

According to the present embodiment, as will be described later, magnetic properties of the magnetic layer 10 are improved by the insertion film 182 being provided between the magnetic layer 10 and the MgO film 181 as a foundation.

Also according to the present embodiment, thermal stability of each layer included in the MTJ element 1 is improved as a result of in the interface between the magnetic layer 10 and the foundation layer 18 being improved by the insertion film 182.

As a result, element characteristics of a magnetoresistive effect element according to the present embodiment are improved.

(b) Characteristics

Element characteristics of a magnetoresistive effect element (MTJ element) according to the embodiment will be described with reference to FIGS. 2 to 14.

Figure 2:
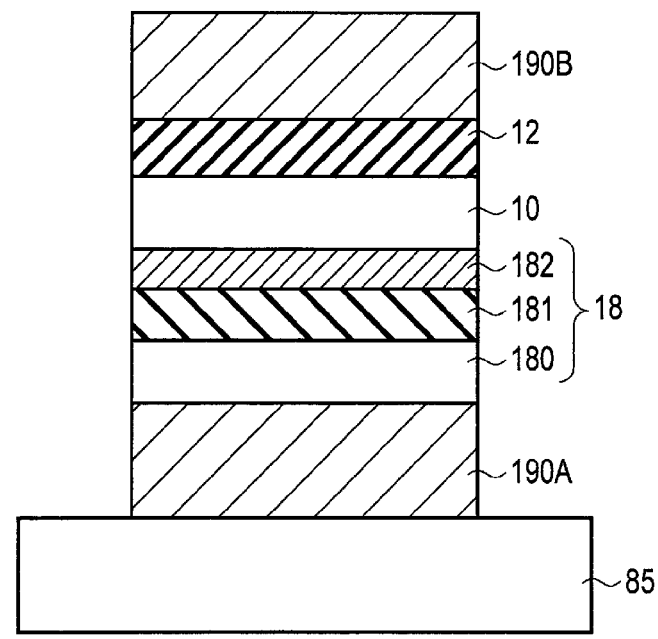
FIG. 2 is a schematic diagram showing the structure of a measurement sample.

When characteristics of a magnetic layer are shown in characteristics of a magnetoresistive effect element according to the present embodiment shown below, a laminated structure 1Z including the magnetic layer 10 shown in FIG. 2 is used as a measurement sample to measure characteristics of a single magnetic layer.

As shown in FIG. 2, the magnetic layer 10 is provided on the foundation layer 18 on a layer 190A. The non-magnetic layer 12 is provided on the top surface of the magnetic layer 10. A cap layer (protective layer) 190B is provided on the non-magnetic layer 12.

The foundation layer 18 includes the lower film 180 on the layer 190A, the upper layer (here, the foundation MgO film) 181 on the lower film 180, and the insertion film 182 on the upper film 181.

In the laminated structure described below, the magnetic layer 10 is a FeCoB film and the films 12, 181 are MgO films. In the present embodiment, however, if the insertion film 182 is provided between the magnetic layer 10 and the upper film 181, the material of the magnetic layer 10 and the material of the films 12, 181 are not specifically limited. The lower film 180 is a film (for example, a laminated film) having a nitride film and/or a boride film.

Each film included in the laminated structure 1Z of FIG. 2 is formed by the sputtering method or the ALD method. Various processes such as annealing are performed on the formed laminated structure 1Z.

Characteristics of a magnetic layer included in the laminated structure 1Z and characteristics of a MTJ element in the present embodiment are measured as described below.

<Perpendicular Magnetic Anisotropy>

The perpendicular magnetic anisotropy of a magnetic layer of the magnetoresistive effect element according to the present embodiment will be described with reference to FIG. 3.

Figure 3:
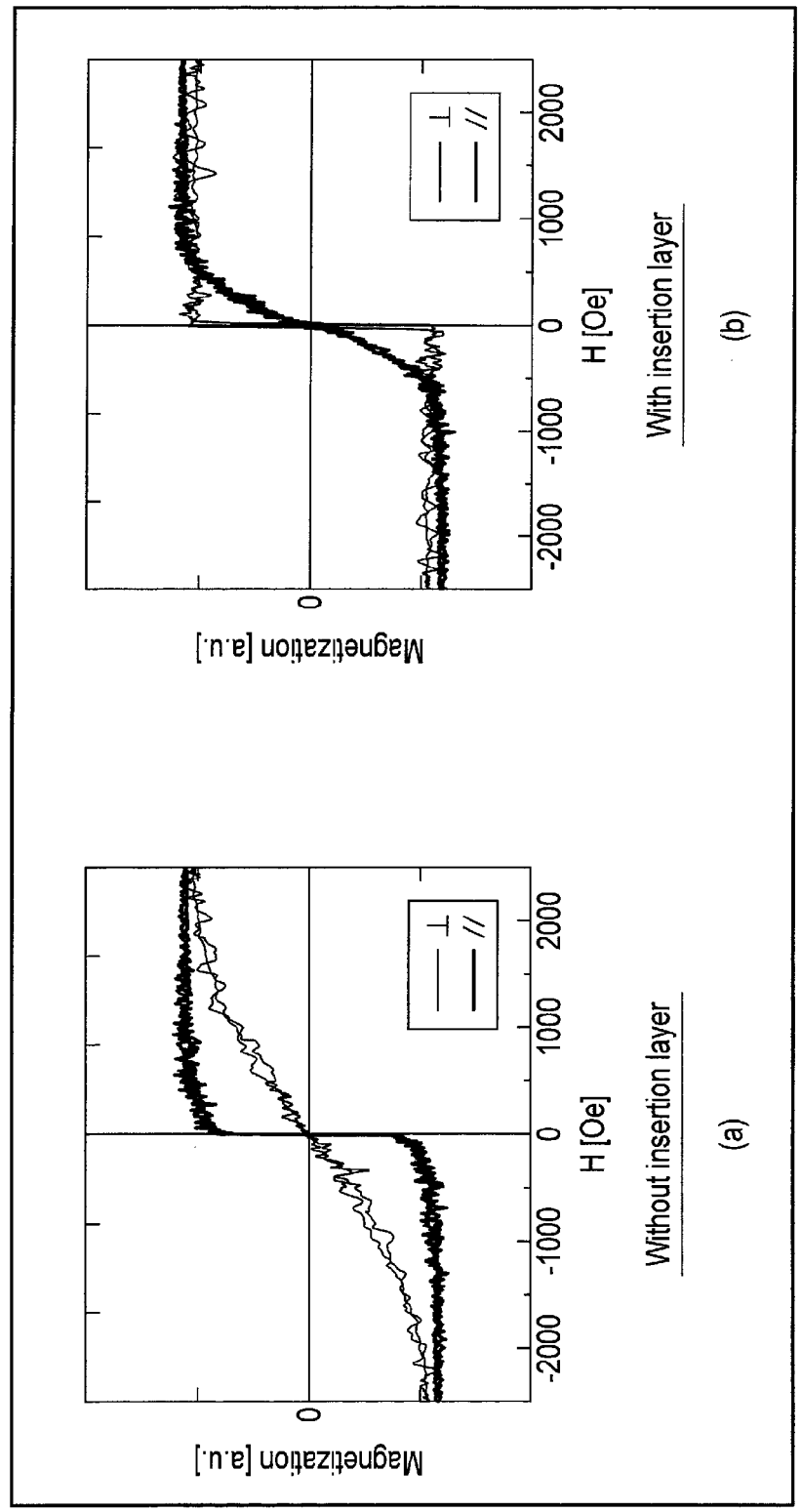
FIG. 3 is diagrams illustrating characteristics of a magnetic layer used in the magnetoresistive effect element according to the first embodiment.

(a) and (b) of FIG. 3 are diagrams showing magnetic anisotropies of a magnetic layer included in a magnetoresistive effect element according to the present embodiment.

(a) of FIG. 3 is a graph showing the relationship between magnetization of the magnetic layer in a structure in which the insertion film is removed from the laminated structure in FIG. 2 (structure including the MgO film/FeCoB film/MgO film) and an external magnetic field applied to the magnetic layer.

(b) of FIG. 3 is a graph showing the relationship between magnetization of the magnetic layer 10 in the laminated structure 1Z of FIG. 2 and an external magnetic field applied to the magnetic layer 10.

In each of (a) and (b) of FIG. 3, the horizontal axis of the graph corresponds to an external magnetic field (unit: Oe) and the vertical axis of the graph corresponds to the magnitude (unit: arbitrary unit) of magnetization of the magnetic layer.

In each of (a) and (b) of FIG. 3, a measurement result when an external magnetic field (hereinafter, called a parallel magnetic field) parallel to the film surface (substrate surface) of the magnetic layer is applied to the laminated structure and a measurement result when an external magnetic field (hereinafter, called a perpendicular magnetic field) perpendicular to the film surface (substrate surface) of the magnetic layer is applied to the laminated structure are shown.

In (b) of FIG. 3, the insertion film 182 is a Nb film. The thickness of the Nb film 182 is about 0.5 nm.

The magnetic layer measured in (a) of FIG. 3 is a FeCoB film sandwiched between MgO films. The top surface and the bottom surface of the FeCoB film are each in contact with the MgO film.

(a) of FIG. 3 shows that the magnetic layer (FeCoB film) in the laminated structure including no insertion film has in-plane magnetic anisotropy with the application of a parallel magnetic field.

In (a) of FIG. 3, however, the magnitude of magnetization of the magnetic layer in a state in which a perpendicular magnetic field is applied is smaller than that of magnetization of the magnetic layer in a state in which a parallel magnetic field is applied to the magnetic layer. This indicates that almost no magnetization is caused by the applied perpendicular magnetic field in the magnetic layer in the laminated structure used for measurement in (a) of FIG. 3 and the magnetic layer does not manifest perpendicular magnetic anisotropy. Thus, the magnetic layer between MgO in the laminated structure including no insertion film in (a) of FIG. 3 is a magnetic layer (in-plane magnetizing film) having in-plane magnetic anisotropy.

In contrast, the measurement result in (b) of FIG. 3 shows that the FeCoB film 10 in the laminated structure 1Z including the insertion film 182 in FIG. 2 is magnetized in a direction perpendicular to the film surface when a perpendicular magnetic field is applied to the laminated structure.

The measurement result shown in (b) of FIG. 3 shows that the magnetic layer 10 in the laminated structure 1Z of FIG. 2 manifests perpendicular magnetic anisotropy and is a perpendicular magnetization film.

Thus, in the laminated structure 1Z in which the FeCoB film 10 is provided between the two MgO films 12, 181, a FeCoB film of perpendicular magnetization is obtained by the insertion film (here, the Nb film) 182 being provided between the bottom surface of the FeCoB film 10 and the top surface of the MgO film 181.

Even after high-temperature annealing, as will be described later, the perpendicular magnetic anisotropy of the FeCoB film 10 is maintained by the agglomeration of the FeCoB film 10 being inhibited by the insertion film 182.

<Anisotropic Magnetic Field>

An anisotropic magnetic field of the magnetic layer of the magnetoresistive effect element according to the present embodiment will be described with reference to FIG. 4.

Figure 4:
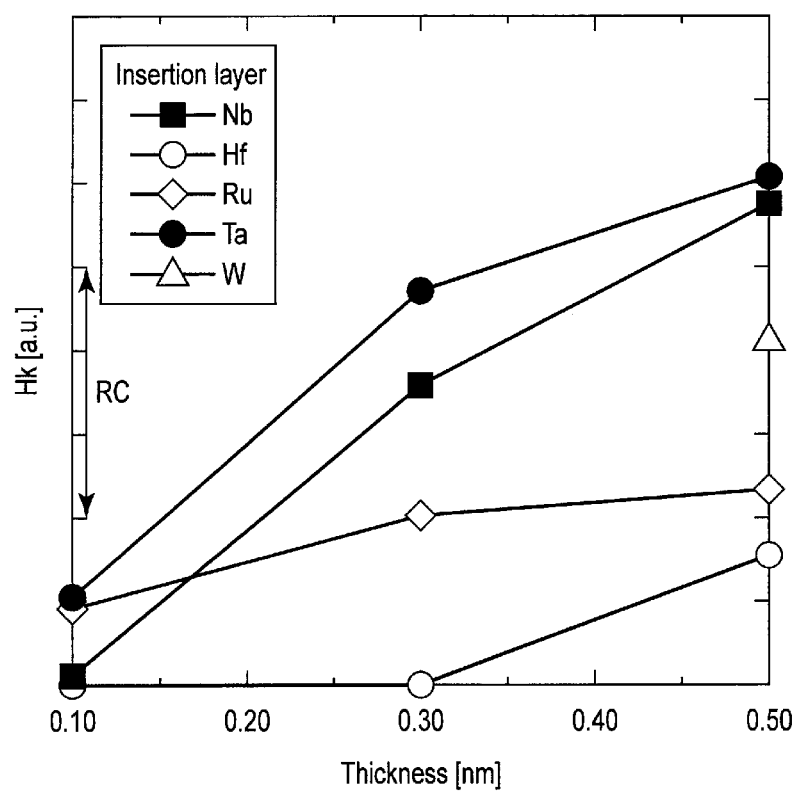
FIG. 4 is a diagram illustrating characteristics of the magnetic layer used in the magnetoresistive effect element according to the first embodiment.

FIG. 4 is a diagram illustrating an anisotropic magnetic field of the magnetic layer included in the magnetoresistive effect element according to the present embodiment. FIG. 4 is a graph showing measurement results of the anisotropic magnetic field of the magnetic layer 10 in the laminated structure 1Z shown in FIG. 2.

In the graph shown in FIG. 4, the relationship between the thickness of the insertion film 182 in the foundation layer 18 and the anisotropic magnetic field ($H_k$) of the magnetic layer 10 is shown.

The horizontal axis of the graph in FIG. 4 corresponds to the thickness (unit: nm) of the insertion film 182. The vertical axis of the graph in FIG. 4 corresponds to the magnitude (unit: arbitrary unit) of the anisotropic magnetic field of the magnetic layer 10.

In FIG. 4, characteristics of the magnetic layer 10 when a plurality of materials is used for the insertion film 182 are shown. In FIG. 4, one film selected from a Nb film, a Hf film, a Ru film, a Ta film, and a W film is used as the insertion film 182.

As shown in FIG. 4, in the range in which the thickness of the insertion film 182 is 0.10 nm to 0.50 nm, the anisotropic magnetic field $H_k$ of the magnetic layer 10 increases with an increasing thickness of the insertion film 182. If the material of the insertion film 182 changes, the trend in which the anisotropic magnetic field of the magnetic layer 10 increases with an increasing thickness of the insertion film 182 is the same.

For example, the magnetic layer as a comparative example has an anisotropic magnetic field in a range RC in FIG. 4.

Thus, with the insertion film 182 being provided between the magnetic layer 10 and the foundation MgO film 181, the quality of the magnetic layer 10 is made better and the anisotropic magnetic field of the magnetic layer 10 is improved.

As shown in FIG. 4, the anisotropic magnetic field of the magnetic layer (FeCoB film) when the Nb or Ta is used as the insertion film 182 is larger than that of the magnetic field when other materials are used as the insertion film 182.

For the following reason, a FeCoB film having a larger anisotropic magnetic field is formed when Nb or Ta is used as the insertion film 182.

A combination of the MgO film and the FeCoB film is used to form a magnetic layer having perpendicular magnetic anisotropy. In the process of forming a MTJ element, a high-quality FeCoB film can be formed by promoting crystallization in the interface between the MgO film and the FeCoB film.

However, boron (B) included in the FeCoB film tends to make a film amorphous and so boron added to the magnetic layer (FeCo film) to form a magnetic layer having perpendicular magnetic anisotropy could inhibit further crystallization of the FeCoB film.

Nb and Ta have the property of adsorbing boron.

If the insertion film 182 is formed of a Nb film or a Ta film, boron in the FeCoB film 10 as a magnetic layer is attracted to the insertion film 182 and boron is segregated near the interface between the FeCoB film 10 and the insertion film 182. The concentration of boron near the interface between the FeCoB film 10 and the MgO film 12 on the upper side (tunnel barrier film side) is lower than that of boron near the interface between the FeCoB film 10 and the insertion film 182.

The generation of crystalline nuclei of the FeCoB film is promoted near the interface between the FeCoB film 10 and the MgO film 12 on the upper side and crystallization of the FeCoB film 10 propagates from the MgO film 12 side to the insertion film 182 side.

As a result, amorphization of the FeCoB film 10 caused by boron is inhibited near the interface between the FeCoB film 10 and the MgO film (tunnel barrier film) 12 and crystallization of the whole FeCoB film 10 is promoted by crystalline nuclei of FeCoB having high crystallinity and high orientation.

As a result, when a Nb film or a Ta film is used as the insertion film 182, the anisotropic magnetic field of the FeCoB film 10 becomes larger.

As will be described later, if the insertion film 182 becomes thicker, the damping factor could become larger. Thus, the thickness of the insertion film 182 is preferably equal to or less than 0.6 nm.

<Thermal Stability>

The thermal stability of the magnetoresistive effect element according to the present embodiment will be described with reference to FIG. 5.

Figure 5:
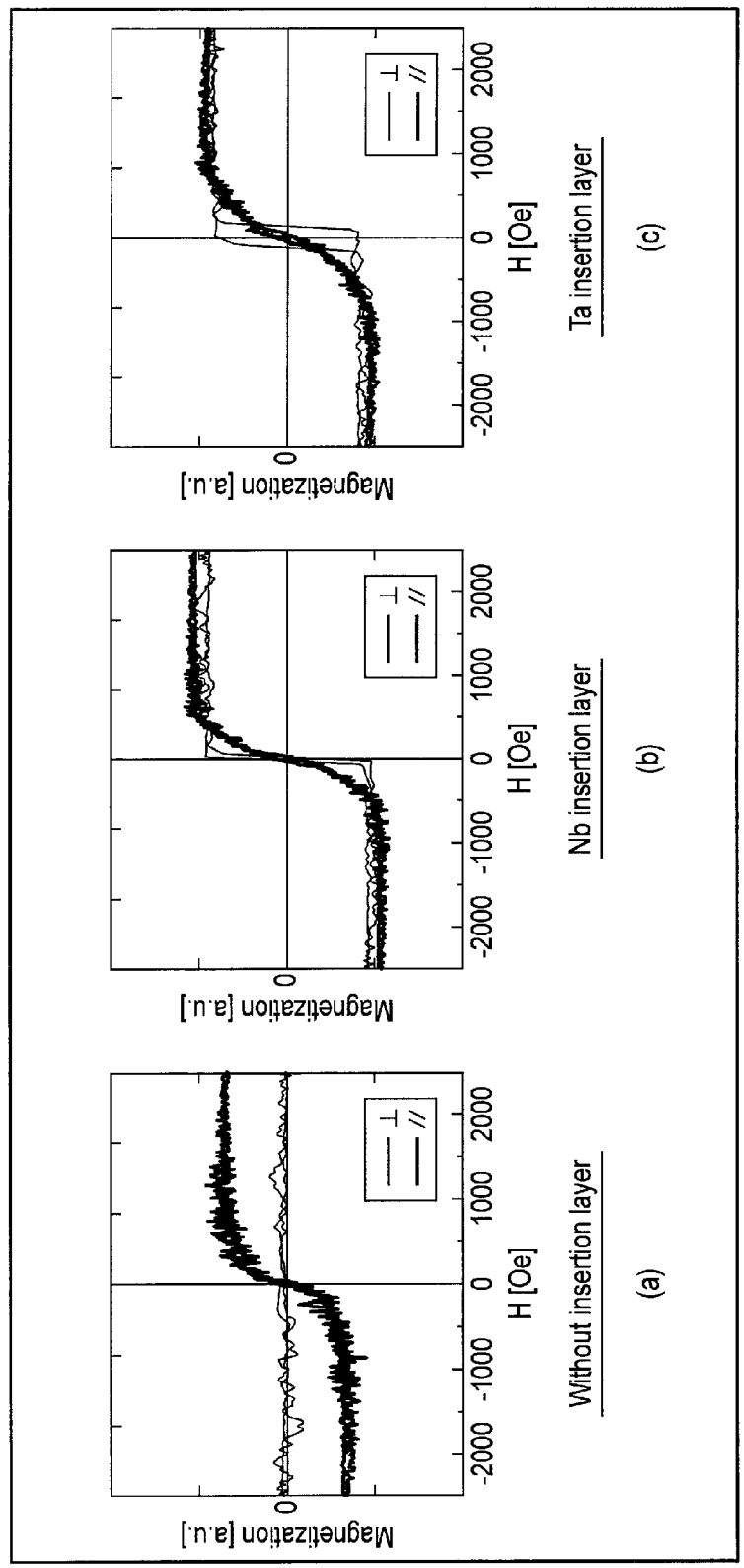
FIG. 5 is diagram illustrating characteristics of the magnetic layer used in the magnetoresistive effect element according to the first embodiment.

(a), (b) and (c) of FIG. 5 are each diagrams showing magnetization characteristics of magnetic layers included in magnetoresistive effect elements according to the present embodiment.

In each of (a) to (c) of the FIG. 5, the horizontal axis of the graph corresponds to an external magnetic field H (unit: Oe) applied to the magnetic layer and the vertical axis of the graph corresponds to the magnitude (unit: arbitrary unit) of magnetization of the magnetic layer.

In each of (a) to (c) of FIG. 5, a parallel magnetic field and a perpendicular magnetic field are each applied to the magnetic layer and the magnetization of the magnetic layer is measured.

(a) of FIG. 5 is a graph showing magnetization characteristics of the magnetic layer when no insertion film is provided. The sample used for measurement in (a) of FIG. 5 has a structure without an insertion film in FIG. 2.

The samples used for measurement in (b) and (c) of FIG. 5 have the laminated structure 1Z in FIG. 2. (b) of FIG. 5 is a diagram showing magnetization characteristics of the magnetic layer when the insertion film 182 of a Nb film is provided between the FeCoB film 10 and the foundation MgO film 181. The thickness of the Nb film is about 0.5 nm. (c) of FIG. 5 is a diagram showing magnetization characteristics of the magnetic layer when the insertion film 182 of a Ta film is provided between the FeCoB film 10 and the foundation MgO film 181. The thickness of the Ta film is about 0.5 nm.

In each of (a) to (c) of the FIG. 5, measurement samples are annealed at 475° C.

As shown in (a) of FIG. 5, the FeCoB film on the foundation layer including no insertion film shows in-plane magnetization only and shows no perpendicular magnetization.

As shown in (b) and (c) of FIG. 5, if the insertion film 182 of a Nb film or a Ta film is provided between the foundation MgO film 181 and the FeCoB film 10, the FeCoB film 10 retains the perpendicular magnetic anisotropy even after high-temperature annealing.

Based on measurement results shown in (a) to (b) of FIG. 5, perpendicular magnetic anisotropy of the FeCoB film is expected not to appear due to the agglomeration of the FeCoB film in the interface between the MgO film and the FeCoB film caused by high-temperature and long-time annealing in the laminated structure of the MgO film/FeCoB film/MgO film including no insertion film.

Figure 6:
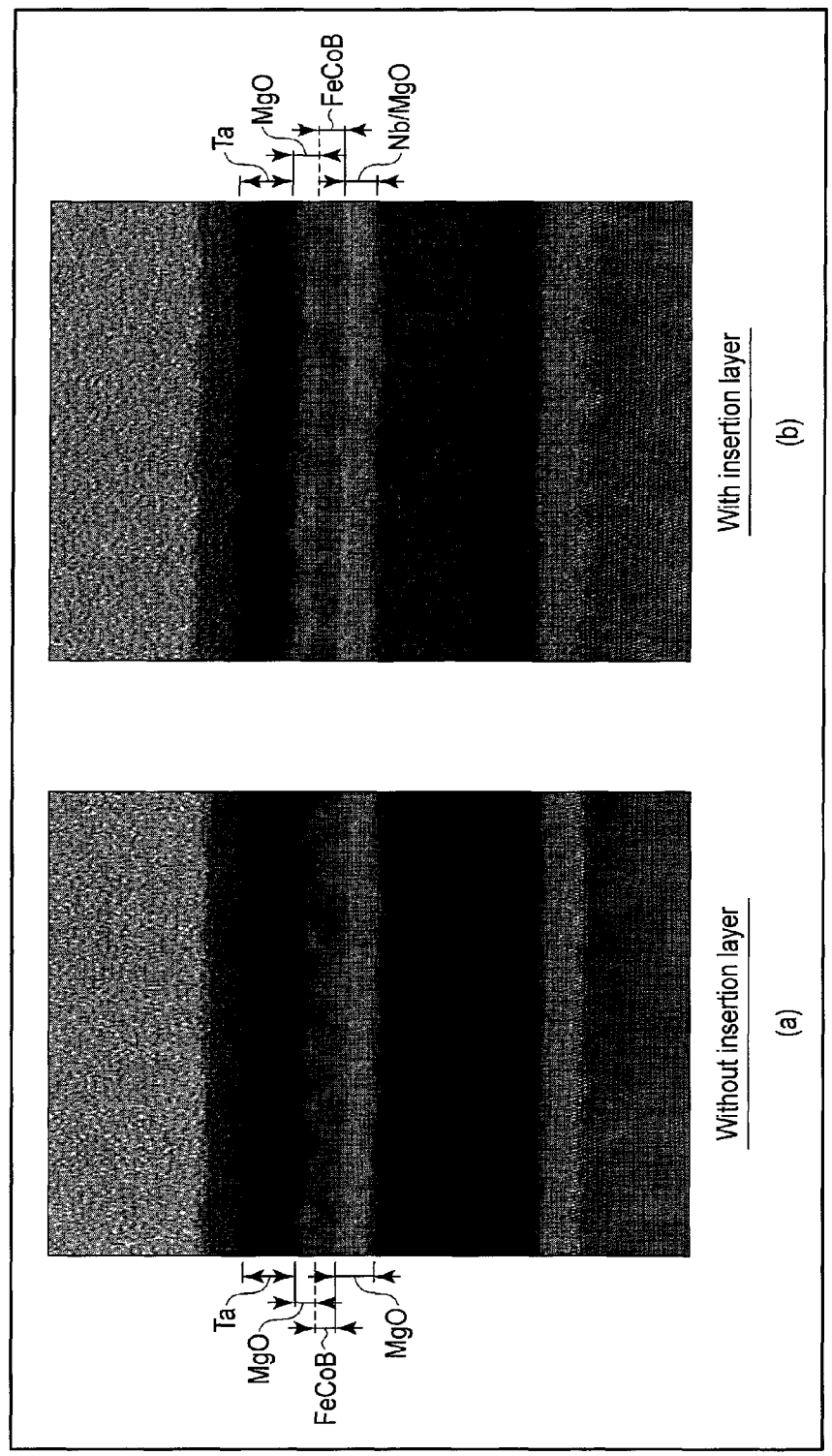
FIG. 6 is diagram illustrating micrographs of the magnetic layer used in the magnetoresistive effect element according to the first embodiment.

(a) and (b) of FIG. 6 are diagrams showing electron microscope images of an annealed laminated structure (magnetic layer).

(a) of FIG. 6 shows an observation image of a cross sectional transmission electron microscope (TEM) of a laminated structure including no insertion layer and (b) of FIG. 6 shows a cross sectional TEM image of a laminated structure including an insertion layer.

In the sample of (a) of FIG. 6, the FeCoB film is provided between two MgO films. The thickness of the FeCoB film is about 1.2 nm. The thickness of two MgO films sandwiching the FeCoB film is 1.0 nm or less.

In the sample (laminated structure 1Z in FIG. 2) of (b) of FIG. 6, the FeCoB film having the thickness of about 1.2 nm and the MgO film having the thickness of 1.0 nm or less are used. The insertion film is a Nb film. The thickness of the Nb film is about 0.5 nm. A laminated film including a Ta film or the like is provided between the foundation MgO film and the substrate. In addition, a cap layer and a protective film are stacked on the top surface of the MgO film on the FeCoB film.

The samples of (a) and (b) of FIG. 6 are each annealed at 400° C.

As shown in (a) of FIG. 6, the interface between the FeCoB film and the MgO film is blurred. Such an observation result of the TEM image indicates the agglomeration of the FeCoB film.

On the other hand, (b) of FIG. 6 shows a steep interface between the FeCoB film and the MgO film. Such an observation result of the TEM image as shown in (b) of FIG. 6 indicates that the FeCoB film is not agglomerated.

FIG. 7 shows the relationship between an external magnetic field and magnetization of the magnetic layer in each sample of FIG. 6. (a) of FIG. 7 is a graph showing the relationship between the external magnetic field and magnetization of the magnetic layer in the sample of (a) of FIG. 6. (b) of FIG. 7 is a graph showing the relationship between the external magnetic field and magnetization of the magnetic layer in the sample of (b) of FIG. 6.

As shown in (a) of FIG. 7, the sample in (a) of FIG. 6 shows in-plane magnetic anisotropy. On the other hand, as shown in (b) of FIG. 7, the sample in (b) of FIG. 6 shows perpendicular magnetic anisotropy.

Figure 8:
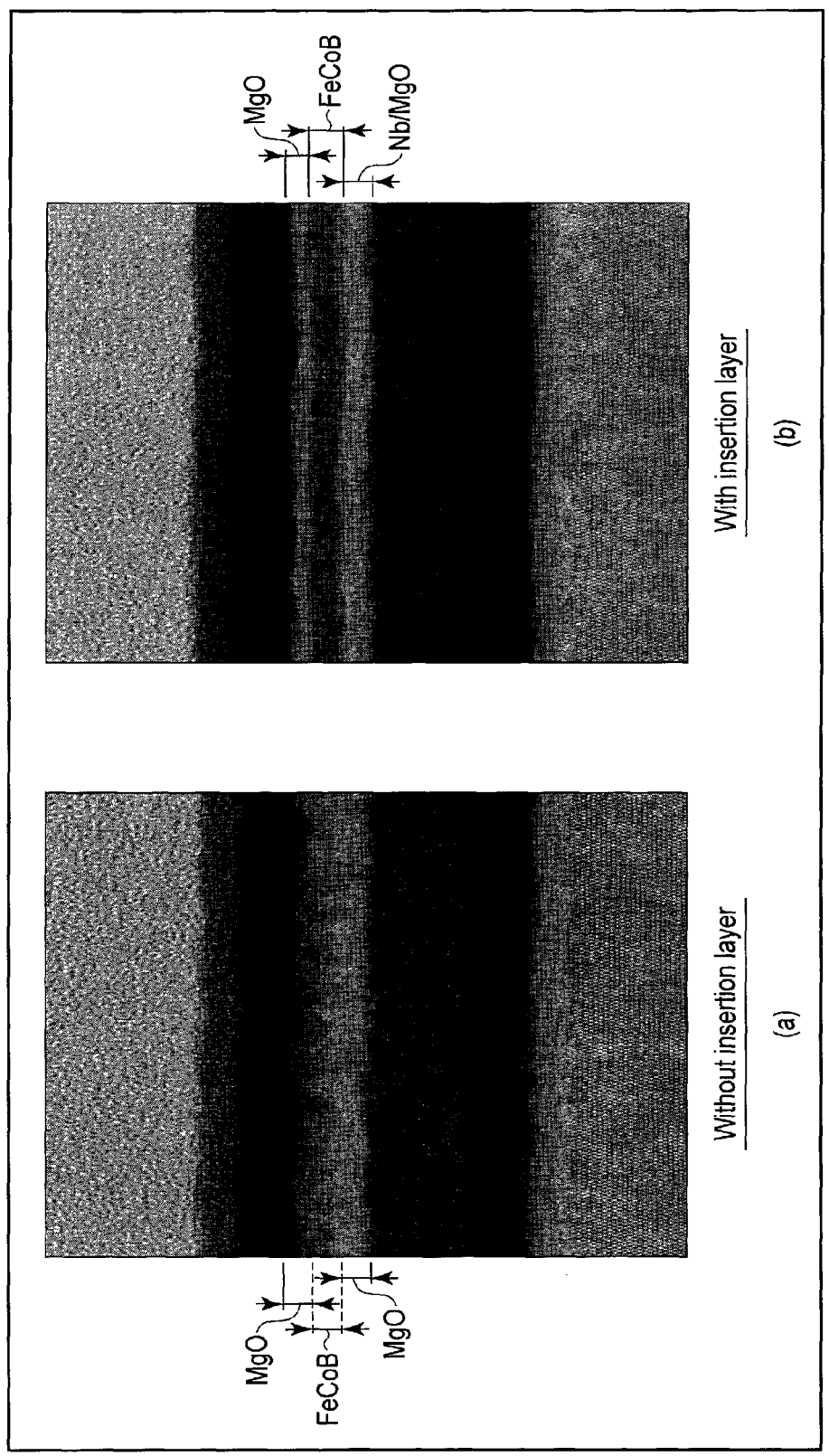
FIG. 8 is diagram illustrating micrographs of the magnetic layer used in the magnetoresistive effect element according to the first embodiment.

(a) of FIG. 8 shows a TEM image of a sample without an insertion layer and (b) of FIG. 8 shows a TEM image of a laminated structure including an insertion layer of Nb.

The configuration of the sample in (a) of FIG. 8 (structure of the sample before annealing) is substantially the same as that of the sample in (a) of FIG. 6.

The configuration of the sample in (b) of FIG. 8 (structure of the sample before annealing) is substantially the same as that of the sample in (b) of FIG. 6. The sample in (b) of FIG. 8 includes, like the sample in (b) of FIG. 6, a Nb film having the thickness of about 0.5 nm as an insertion film.

The samples of (a) and (b) of FIG. 8 are each annealed at 475° C.

As shown in (a) of FIG. 8, the agglomeration occurs in the FeCoB film without the insertion film, and this is similar to the TEM image of (a) of FIG. 6. Therefore, the boundary between the FeCoB film and the MgO film becomes unclear.

On the other hand, as shown in (b) of FIG. 8, the boundary between the FeCoB film and the MgO film is clear in the sample provided with an insertion film. Therefore, no agglomeration of the FeCoB film occurs in the sample provided with an insertion film.

FIG. 9 is graph showing the relationship between an external magnetic field and magnetization of the magnetic layer in each sample of FIG. 8. (a) of FIG. 9 is a graph showing the relationship between the external magnetic field and magnetization of the magnetic layer in the sample of (a) of FIG. 8. (b) of FIG. 9 is a graph showing the relationship between the external magnetic field and magnetization of the magnetic layer in the sample of (b) of FIG. 8.

As shown in (a) of FIG. 9, the sample in (a) of FIG. 8 shows in-plane magnetic anisotropy. On the other hand, as shown in (b) of FIG. 9, the sample in (b) of FIG. 8 shows perpendicular magnetic anisotropy.

Thus, it turns out that the perpendicular magnetic anisotropy of the magnetic layer is related to the presence/absence of an occurrence of agglomeration of the magnetic layer.

Measurement results in FIGS. 6 to 9 show that the agglomeration of the magnetic layer is inhibited by an insertion film (here, a Nb film) being provided. As a result of poor wettability between the magnetic layer (FeCoB film) 10 and the insulating film (MgO film) 181 being improved by the insertion film 182, the agglomeration of the magnetic layer originating from application of a large amount of thermal energy can be inhibited.

Based on measurement results in FIGS. 6 to 9, it turns out that the perpendicular magnetic anisotropy of the magnetic layer appears as a result of the agglomeration of the magnetic layer being inhibited.

Therefore, with an insertion layer being provided between the magnetic layer and the MgO film as a foundation layer, deterioration of the magnetic layer caused by a large amount of thermal energy is prevented and a MTJ element according to the present embodiment has high thermal stability characteristics.

<Damping Factor>

The damping factor between layers included in a magnetoresistive effect element according to the present embodiment will be described with reference to FIGS. 10 and 11.

FIG. 10 is a diagram showing the damping factor between layers in the magnetoresistive effect element according to the present embodiment.

The horizontal axis in FIG. 10 represents the material used for the insertion film between the FeCoB film and the MgO film and the vertical axis in FIG. 10 represents the magnitude of a damping factor $\alpha$. The damping factor is a dimensionless value.

The samples used for measurement of the damping factor in FIG. 10 have the laminated structure 1Z shown in FIG. 2. The magnetic layer 10 is a FeCoB film having the thickness of about 1.2 nm. Each of the MgO films 12, 181 has the thickness of 1 nm or less.

FIG. 10 shows the damping factors when one of a Nb film, a Hf film, a Ru film, a W film, and a Ta film is used as the insertion film 182.

In FIG. 10, as a comparative example, the damping factor of the structure in which the insertion film is removed from the laminated structure in FIG. 2 is shown.

In addition, each sample in FIG. 10 is annealed at least at one of 400° C. and 450° C.

As shown in FIG. 10, the magnitude of the damping factor changes in accordance with the materials of the insertion film 182 and the foundation layer.

The laminated structure 1Z in which the insertion film 182 is provided between the foundation MgO film 181 and the magnetic layer 10 has a smaller damping factor than a structure in which the insertion film 182 is not provided.

The damping factor when, for example, Nb, Hf, or W is used for the insertion film 182 is equal to or less than half the damping factor when no insertion film is provided.

The damping factor of a foundation layer made of an insulator tends to be smaller than that of a foundation layer made of metal. Therefore, like in the present embodiment, the foundation layer 18 including the extremely thin metal film 182 and the MgO film 181 can provide a storage layer 10 with a smaller damping factor than that of a foundation layer made of only a metal film.

FIG. 11 is a graph showing the relationship between the thickness of the insertion film in the foundation layer and the damping factor. The horizontal axis of the graph in FIG. 11 corresponds to the thickness of the insertion film and the vertical axis of the graph in FIG. 11 corresponds to the magnitude of the damping factor.

The sample measured in FIG. 11 has the structure in FIG. 2. The magnetic layer is a FeCoB film and the FeCoB film is provided between MgO films. The insertion film is a Nb film. The thickness of the Nb film is in the range of 0 nm to 0.50 nm. When the thickness of the Nb film is 0 nm, a structure in which no insertion film is provided between the FeCoB film and the foundation MgO film is indicated.

As shown in FIG. 11, the damping factor tends to decrease in the thickness range of 0.1 nm to 0.5 nm with an increasing thickness of the insertion film (Nb film).

However, if the insertion film 182 becomes too thick, the damping factor shows a tendency to increase. Thus, the thickness of the insertion film 182 is preferably equal to or less than 0.6 nm. If, for example, the insertion film is a Nb film, the thickness of the Nb film is preferably in the range of 0.1 nm to 0.5 nm.

In the present embodiment, the tendency of change of the damping factor shown in FIG. 11 is common even if the material of the insertion film is changed. However, the size of thickness of the insertion film may change in accordance with materials of the magnetic layer, the upper film (here, the foundation MgO film), and the insertion film.

As shown in FIGS. 10 and 11, a MTJ element according to the present embodiment can make the damping factor smaller by the insertion film 182 being provided between the magnetic layer and the foundation MgO film.

<Magnetic Resistance Characteristics>

Characteristics of the magnetic layer of the magnetoresistive effect element according to the present embodiment will be described with reference to FIGS. 12 and 13.

FIG. 12 is a diagram showing the relationship between the value of resistance of the MTJ element according to the present embodiment and an MR ratio.

The horizontal axis of the graph in FIG. 12 corresponds to a resistance and area product RA (unit: $\Omega \cdot cm^2$) of the MTJ element and the vertical axis of the graph in FIG. 12 corresponds to the MR ratio (unit: %) of the MTJ element.

The storage layer 10 is a FeCoB film having the thickness of about 1.5 nm. A Nb film is used as the insertion film 182 between the storage layer (FeCoB film) 10 and the foundation MgO film 181.

In FIG. 12, the relationship between the resistance and area product RA of the MTJ element including no insertion film and the MR ratio is shown as a comparative example. As shown in FIG. 12, when the MTJ element including no insertion film has a resistance and area product RA of about 25 $\Omega \cdot cm^2$, the MTJ element including no insertion film has an MR ratio of about 90%.

As shown in FIG. 12, when the MTJ element according to the present embodiment has a resistance and area product RA of about 27 $\Omega \cdot cm^2$, the MTJ element according to the present embodiment has an MR ratio of 150 to 155%.

Also, when the MTJ element according to the present embodiment has a resistance and area product RA of about 35 $\Omega \cdot cm^2$, the MTJ element according to the present embodiment has an MR ratio of 120 to 130%.

As a result of the storage layer 10 having a high anisotropic magnetic field being obtained, the MR ratio of the MTJ element 1 according to the present embodiment becomes high.

Thus, the MTJ element according to the present embodiment has, when compared with a MTJ element including no insertion film, a higher MR ratio.

FIG. 13 is a graph showing the relationship between the temperature of annealing for the MTJ element according to the present embodiment and the MR ratio of the MTJ element. The horizontal axis of the graph in FIG. 13 corresponds to the annealing temperature and the vertical axis of the graph in FIG. 13 corresponds to the MR ratio of the MTJ element.

In FIG. 13, the MTJ element is annealed by electron beam annealing.

When, as shown in FIG. 13, the temperature of the annealing is about 400° C., the MTJ element according to the present embodiment has an MR ratio of about 130%. If the MTJ element is annealed in the range of 450° C. to 475° C., the MR ratio of the MTJ element rises to 150% or more.

Therefore, the MR ratio of the MTJ element according to the present embodiment can be improved by high-temperature annealing.

Even if the MTJ element according to the present embodiment is further annealed at about 475° C., deterioration of the MR ratio of the MTJ element is not caused by the annealing. That is, the MTJ element according to the present embodiment has a high thermal stability.

The thermal stability of the MTJ element according to the present embodiment will be described with reference to FIG. 14.

Each of (a), (b) and (c) of FIG. 14 is a graph showing the relationship between an external magnetic field and a magnetic property of the annealed MTJ element according to the present embodiment.

In (a) to (c) of FIG. 14, the horizontal axis of each graph corresponds to the external magnetic field H (unit: Oe) and the vertical axis of each graph corresponds to a magnetic property $M_s t$ (unit: $emu/cm^2$) of the MTJ element. In (a) to (c) of FIG. 14, the magnetization of the MTJ element is represented as a product of saturation magnetization $M_s$ of the MTJ element and a thickness t.

(a) of FIG. 14, a magnetic property (magnetization curve) of a MTJ element according to the present embodiment when the MTJ element is annealed at 400° C. is shown. And also, (b) and (c) of FIG. 14, magnetic property (magnetization curve) of the MTJ element according to the present embodiment when the MTJ element is annealed at 450° C. and when the MTJ element is annealed at 475° C. are shown, respectively.

As shown in (a) to (c) of FIG. 14, with the insertion film 182 being provided between the magnetic layer (for example, a FeCoB film) 10 and the foundation MgO film 181, the MTJ element according to the present embodiment holds an M-H loop capable of realizing a high-resistance state and a low-resistance state of the MTJ element and the magnetic property of the MTJ element hardly deteriorates even if the MTJ element according to the present embodiment is annealed at about 400° C. to 500° C.

As described above, a MTJ element including a MgO film/FeCoB film/insertion film/MgO film like in the present embodiment has thermal stability and characteristics of the MTJ element can be improved by a high-temperature annealing.

Therefore, according to the present embodiment, a MTJ element with high thermal stability and high element characteristics can be provided.

(c) Summary

A MgO film is used as a tunnel barrier film to form a MTJ element of a large MR ratio. In consideration of increasingly finer element structures, a MTJ element using a magnetic layer of perpendicular magnetic anisotropy is used for a memory element of a magnetic memory.

When the magnetic layer (a storage layer and a reference layer) included in the MTJ element is a perpendicular magnetization film, perpendicular magnetic anisotropy of the magnetic layer is formed by using, for example, magnetocrystalline anisotropy or interfacial magnetic anisotropy of the magnetic layer.

Therefore, from the viewpoint of improving magnetocrystalline anisotropic energy or interfacial magnetic anisotropic energy in the magnetic layer of perpendicular magnetization, a structure in which the magnetic layer is sandwiched between two MgO films may be used for a MTJ element.

When a MTJ element is exposed to high-temperature conditions, the magnetic film having a thin film due to increasingly finer element structures may be agglomerated. The agglomeration of the magnetic layer is caused by poor wettability (poor surface smoothness of an insulating film) in the interface between a metal (magnetic layer) and an insulator (MgO film). If wettability between the magnetic layer and the MgO film is poor, the magnetic layer (for example, a thin magnetic layer) minimizes the contact area with the MgO film by using thermal energy such that the surface energy (interface energy) between the magnetic layer and the MgO film is made smaller. As a result, the shape of the magnetic layer becomes spherical and the magnetic layer is agglomerated.

To avoid agglomeration of the magnetic layer, the MTJ element may not be annealed at high temperature, which is intended to improve characteristics of the MTJ element. In addition, characteristics of the magnetic layer and the MTJ element may be degraded by the temperature at which an interlayer insulating film covering the MTJ element is formed.

In a magnetoresistive effect element according to the present embodiment, the insertion film 182 is provided between the magnetic layer (for example, a Co—Fe magnetic layer) 10 and the Mg oxide film (for example, a MgO film) 181 to be the foundation.

The surface (the face on the storage layer side) of the insertion film 182 is smooth (flat) as compared with that of the Mg Oxide film 180.

Thus, the insertion film 182 improves the wettability (surface smoothness) of the surface of the Mg oxide film 180 in the foundation layer 18. The surface smoothness of the foundation layer 18 on the top surface of the foundation layer 18 to be the contact surface with the magnetic layer 10 is improved by the insertion film 182.

Accordingly, even if a large amount of thermal energy is given to the MTJ element 1 according to the present embodiment, the agglomeration of the magnetic layer 10 is inhibited.

Thus, thermal stability of the MTJ element according to the present embodiment is improved.

With improved thermal stability of the MTJ element, the MTJ element according to the present embodiment can improve a quality/characteristics of the tunnel barrier film and the magnetic layer by being annealed at a relatively high temperature (for example, 500° C. or lower) and element characteristics (for example, the MR ratio) can be improved.

In the MTJ element 1 according to the present embodiment, with improved surface smoothness of the foundation layer 18 by the insertion film 182, the flat magnetic layer 10 is formed and crystallinity of the magnetic layer 10 is improved. The insertion layer 182 is thin and therefore, the insertion film 182 hardly affects the crystal growth of the magnetic layer 10 based on the foundation MgO film 181 adversely.

Accordingly, magnetic properties of the magnetic layer 10 of the MTJ element 1 according to the present embodiment are improved and the magnetic layer 10 manifests perpendicular magnetic anisotropy and has a high anisotropic magnetic field. Consequently, thermal stability (for example, resistance to a thermal disturbance) of the MTJ element according to the present embodiment is improved.

When data writing into a MTJ element using STT is taken into consideration, a material whose damping factor is small is preferably used for the MTJ element to reduce the write current. That is, it is desired to reduce spin pumping arising between the storage layer 10 and the foundation layer 18 to decrease the damping factor of the storage layer 10.

With the insertion film 182 in contact with the magnetic layer 10 being provided in the foundation layer 18, when compared with a case in which a foundation layer without an insertion film being provided is used for a MTJ element, the damping factor can be reduced. Therefore, a MTJ element according to the present embodiment can reduce the write current (magnetization reversal current).

From the above, a magnetoresistive effect element according to the first embodiment can improve thermal stability and element characteristics.

(2) Second Embodiment

A magnetoresistive effect element according to the second embodiment will be described with reference to FIGS. 15 and 16. In the present embodiment, descriptions that overlap with those of the first embodiment are omitted.

In a MTJ element according to the first embodiment, a metal film as an insertion film is provided between a magnetic layer (for example, a storage layer including a FeCoB film) and a Mg oxide film (MgO foundation film) in a foundation layer.

Figure 15:
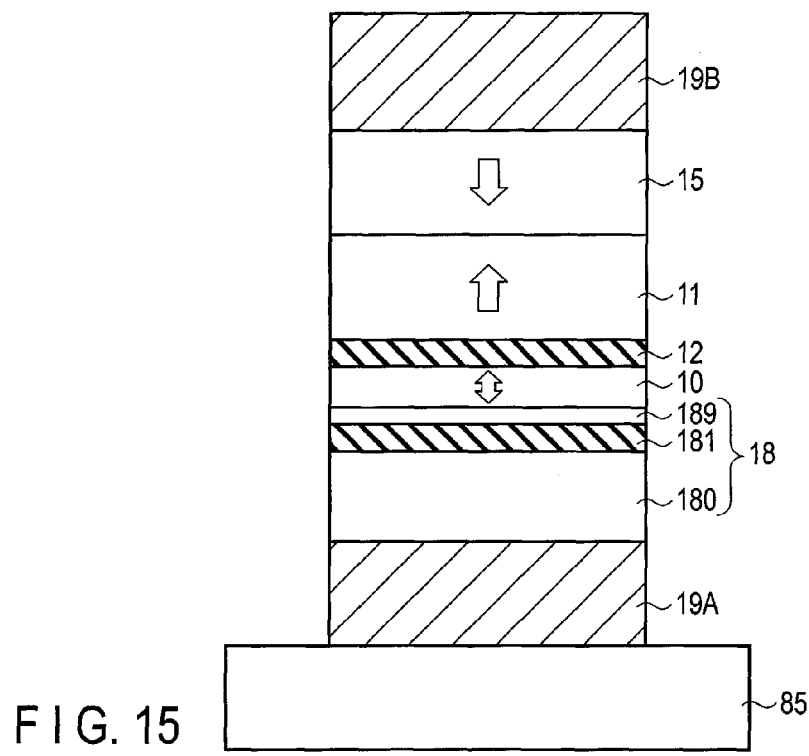
FIG. 15 is a diagram showing a configuration example of a magnetoresistive effect element according to a second embodiment.

As shown in FIG. 15, instead of the metal film, a compound film 189 may be used as the insertion film 189.

For example, a conductive nitride film or a conductive oxide film is used as the insertion film 189. Examples of the compound film as the insertion film 189 include a titanium nitride film (TiN film), a tantalum nitride film (TaN film), a tin-doped indium oxide film (ITO film), and a conductive ZnO film. The conductive ZnO film includes at least one of aluminum (Al), indium (In), gallium (Ga) and the like as a dopant for ZnO. However, the conductive ZnO film may be a non-doped ZnO film.

The insertion film 189 made of a compound film is preferably an extremely thin film so that crystallization between the magnetic layer and the MgO is promoted. The thickness of the insertion film 189 is preferably equal to or less than 0.6 nm.

When a conductive nitride film or a conductive oxide film is used as the insertion film 189, effects similar to those in the first embodiments can be obtained.

The insertion film 189 may be a MgO film including impurities.

A MgO film including impurities may be provided between the FeCoB film 10 and the foundation MgO film 189. The MgO film including impurities is, for example, a MgO film including Fe (hereinafter, denoted as a MgFeO film).

The MgFeO film (MgFeO layer) is preferably a film including a plurality of crystal grains of 5 nm or less. Hereinafter, a film including a plurality of crystal grains of 5 nm or less will be called a fine crystal film.

The MgFeO fine crystal film is preferably (001)-oriented. The MgFeO film may be an amorphous film.

When compared with the MgO film, the MgFeO film has better surface smoothness of the film and can improve wettability on the surface (top surface) of the film. Therefore, when the MgFeO film is used as the insertion film 189, agglomeration of a magnetic layer 10 on a foundation layer 18 can be prevented and magnetic properties and thermal stability of the magnetic layer 10 can be improved.

In addition, residual magnetization of the FeCoB film 10 can be improved and also magnetic anisotropy of the FeCoB film 10 can be improved by the MgFeO fine crystal film being used as the insertion film 189.

Therefore, even if the insertion film 189 is a MgO film including impurities, the MTJ element 1 according to the present embodiment can include the magnetic layer 10 having high magnetic properties.

Further, when compared with a non-doped MgO film, the MgFeO film can reduce resistivity (resistance and area product RA). Therefore, the MTJ element 1 according to the present embodiment in which the MgFeO film is used as the insertion film 189 can reduce the value of resistance of the MTJ element 1 and also reduce the current to be supplied to the MTJ element 1.

Figure 16:
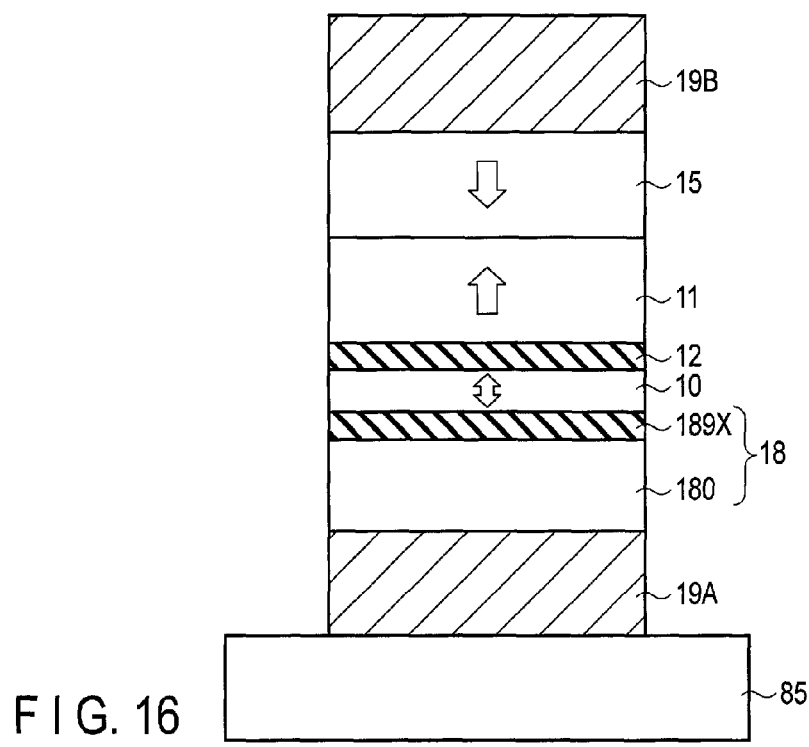
FIG. 16 is a diagram showing a modification of the magnetoresistive effect element according to the second embodiment.

FIG. 16 is a schematic sectional view showing a modification of the MTJ element according to the present embodiment.

When the MgFeO film is provided in a foundation layer 18, as shown in FIG. 16, the foundation layer 18 may not include a foundation MgO film between a MgFeO film 189X and a lower electrode 19A. The MgFeO film 189X of the MTJ element 1 in FIG. 16 may be a film of at least one element selected from a group including Nb, Ru, Hf, Ta, W, and a conductive compound.

A tunnel barrier film 12 may be formed from a MgFeO film. In this case, a storage layer 10 is sandwiched between a MgFeO film as the tunnel barrier film 12 and a MgFeO film as an insertion film (or a foundation film) 182.

From the above, a magnetoresistive effect element according to the second embodiment can improve thermal stability and element characteristics.

(3) Application Example

An application example of a magnetoresistive effect element according to an embodiment will be described with reference to FIGS. 17 and 18.

In the present application example, the same reference signs are attached to substantially the same components as described in the above embodiments and the description of such components will be provided when necessary.

The magnetoresistive effect element in the above embodiments is used as a memory element of, for example, an MRAM (Magnetoresistive Random Access Memory). In the present application example, an STT type MRAM will be illustrated.

Figure 17:
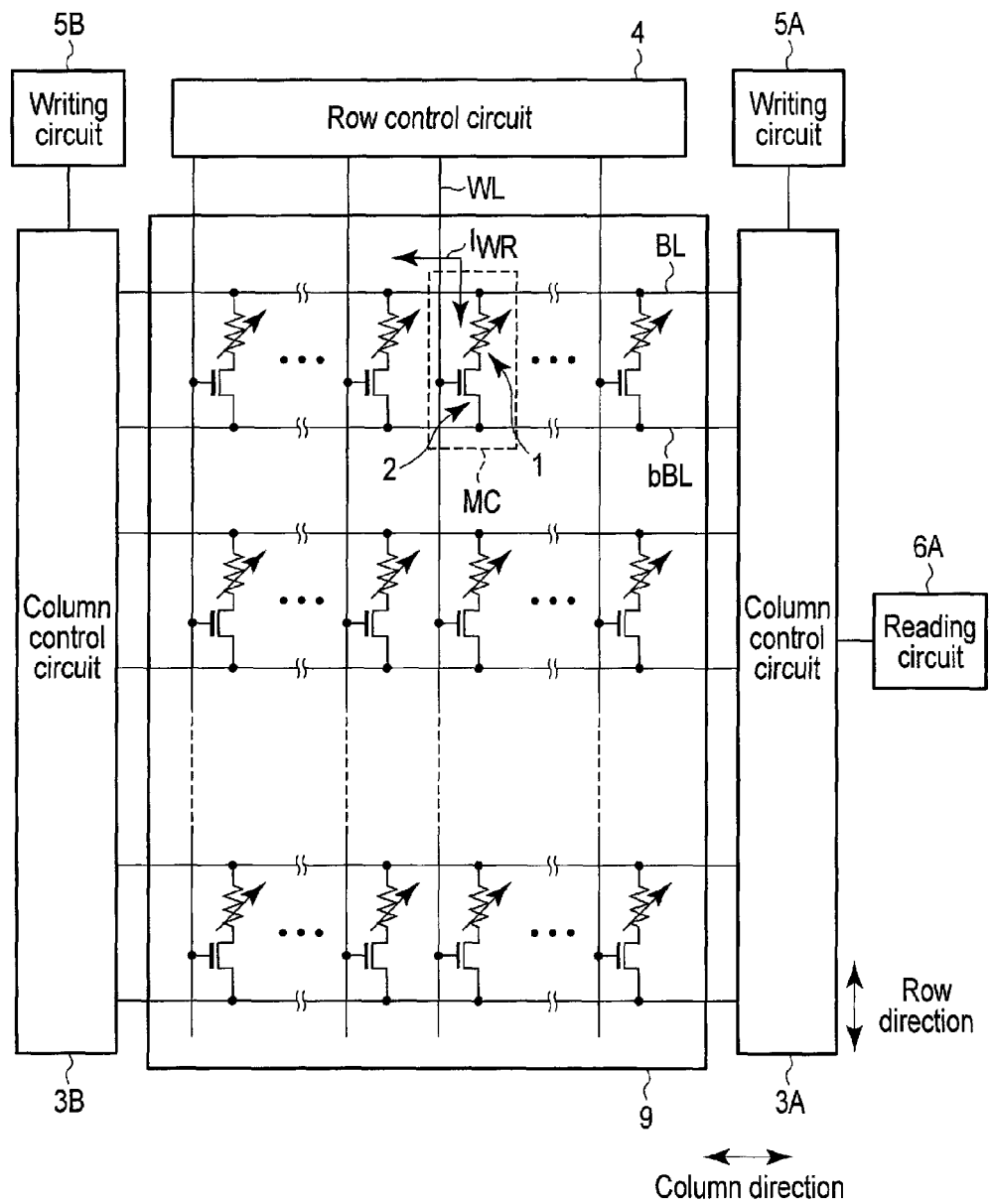
FIG. 17 is a diagram illustrating an application example of a magnetoresistive effect element according to an embodiment.

FIG. 17 is a diagram showing a circuit configuration of a memory cell array of MRAM of the present application example and a neighborhood thereof.

As shown in FIG. 17, a memory cell array 9 includes a plurality of memory cells MC.

The plurality of memory cells MC are arranged in the memory cell array 9. In the memory cell array 9, a plurality of bit lines BL, bBL and a plurality of word lines WL are provided. The bit lines BL, bBL extend in a column direction and the word lines WL extend in a row direction. The two bit lines BL, bBL form a bit line pair.

The memory cell MC is connected to the bit lines BL, bBL and the word line WL.

The plurality of memory cells MC arranged in the column direction are connected to the common bit line pair BL, bBL. The plurality of memory cells MC arranged in the row direction are connected to the common word line WL.

The memory cell MC includes, for example, one MTJ element 1 as a memory element and one select switch 2. The MTJ element 1 described in the first or second embodiment is used as the MTJ element 1 in the memory cell MC.

The select switch 2 is, for example, a field-effect transistor. Hereinafter, the field-effect transistor as the select switch 2 will be referred to as a select transistor (or a cell transistor) 2.

One end of the MTJ element 1 is connected to the bit line BL and the other end of the MTJ element 1 is connected to one end (source/drain) of a current path of the select transistor 2. The other end (drain/source) of the current path of the select transistor 2 is connected to the bit line bBL. A control terminal (gate) of the select transistor 2 is connected to the word line WL.

One end of the word line WL is connected to a row control circuit 4. The row control circuit 4 controls activation/inactivation of the word line based on an address signal from outside.

Column control circuits 3A, 3B are connected to one end and the other end of the bit lines BL, bBL. The column control circuits 3A, 3B control activation/inactivation of the bit lines BL, bBL based on an address signal from outside.

Writing circuits 5A, 5B are connected to one end and the other end of the bit lines BL, bBL via the column control circuits 3A, 3B respectively. Each of the writing circuits 5A, 5B has a source circuit such as a current source or a voltage source to generate a write current $I_{WR}$ and a sink circuit to absorb the write current $I_{WR}$.

In an STT type MRAM, the writing circuits 5A, 5B supply the write current $I_{WR}$ to the memory cell selected from outside (hereinafter, called a selected cell) when data is written.

When data is written into the MTJ element 1, the writing circuits 5A, 5B bidirectionally pass the write current $I_{WR}$ in accordance with data written into the selected cell to the MTJ element 1 in the memory cell MC. That is, the writing circuits 5A, 5B output the write current $I_{WR}$ from the bit line BL to the bit line bBL or the write current $I_{WR}$ from the bit line bBL to the bit line BL in accordance with data written into the MTJ element 1.

A reading circuit 6A is connected to the bit lines BL, bBL via the column control circuit 3A. The reading circuit 6A includes a voltage source or a current source that generates a read current, a sense amplifier that detects and amplifies a read signal, a latch circuit that temporarily holds data and the like. The reading circuit 6A supplies a read current to the selected cell when data is read from the MTJ element 1.

The current value or the potential of a reading node (bit line) differs in accordance with the magnitude of the value of resistance of the MTJ element 1 to which a read current is supplied. The reading circuit 6A detects a variation (a read signal or read output) in accordance with the magnitude of the value of resistance to determine the data stored in the MTJ element 1.

For example, a buffer circuit, a state machine (control circuit), or an ECC (Error Checking and Correcting) circuit may be provided in the same chip as the memory cell array 9.

FIG. 18 is a sectional view showing an example of the structure of the memory cell MC provided in the memory cell array 9 of the MRAM of the present application example. In FIG. 18, members in the backward direction (or the forward direction) are indicated by a broken line.

The memory cell MC is formed in an active area (semiconductor area) AA of a semiconductor substrate 90. The active area AA is partitioned by an insulating film 89 embedded in an element isolation area of the semiconductor substrate 90.

The surface of the semiconductor substrate 90 is covered with interlayer insulating films 85, 86.

The MTJ element 1 is provided on the interlayer insulating film 85 and is covered with the interlayer insulating film 86.

An insulating film (sidewall insulating film) 100 is provided on the side surface of the MTJ element 1. An insulating oxide film, an insulating nitride film, or an insulating boride film is used for the sidewall insulating film 100. The sidewall insulating film 100 may be a laminated film including at least one of an insulating oxide film, an insulating nitride film, and an insulating boride film.

The top end of the MTJ element 1 is connected to the bit line BL via an upper electrode 19B. The bottom end of the MTJ element 1 is connected to a source/drain diffusion layer 25 of the select transistor 2 via a lower electrode 19A and a contact plug CP1 embedded in the interlayer insulating film 85. A source/drain diffusion layer 26 of the select transistor 2 is connected to the bit line bBL (not shown) via a contact plug CP2 provided in the backward direction (for the forward direction).

The select transistor 2 is a field-effect transistor in an embedded gate structure.

A gate electrode 21 is embedded in the active area AA between the source/drain diffusion layer 25 and the source/drain diffusion layer 26. A gate insulating film 20 is provided between the gate electrode 21 and the active area AA. The gate electrode 21 extends in the row direction and is used as the word line WL.

An effective gate length (channel length) can be increased without enlarging a plane size of a transistor due to the select transistor 2 in an embedded gate structure. As a result, the size of the memory cell MC can be decreased and a leak current of the select transistor 2 can be reduced.

Incidentally, two memory cells MC may be provided next to each other in the column direction in the active area AA such that the two select transistors 2 share the one contact plug CP2 and the source/drain diffusion layer 26.

The select transistor 2 may be a field-effect transistor in a planar structure or FinFET.

The select transistor 2 can be formed by known technologies.

The one MTJ element 1 selected from a plurality of the above embodiments is used as a memory element of MRAM.

As described above, the MTJ element 1 in the memory cell MC includes an insertion film 182 between the magnetic layer (storage layer) 10 and a Mg oxide film 181.

The insertion film 182 has at least one film selected from a group including a metal film, a conductive compound film, and a Mg oxide film including impurities. When the insertion film 182 is a metal film, the material of the insertion film 182 is selected from Nb, Hf, Ta, Ru, W or the like.

Magnetic properties of the magnetic layer (for example, the storage layer) 10 can be improved by the insertion film 182. As a result, an MRAM including the MTJ element 1 according to the present embodiment can improve characteristics of the MTJ element 1 as a memory element.

Agglomeration of the magnetic layer 10 after a high-temperature annealing can be prevented by the insertion film 182 being provided between the magnetic layer 10 and the foundation MgO film 181. Thermal stability of the MTJ element according to the present embodiment is improved. As a result, the MRAM including the MTJ element 1 according to the present embodiment can improve characteristics of the magnetic layer 10 and the MTJ element 1 by the high-temperature (for example, about 400° C. to 500° C.) annealing.

Also, the MRAM including the MTJ element 1 according to the present embodiment can inhibit the MTJ element 1 including the magnetic layer 10 from deteriorating from heat during manufacturing processes (for example, heat to form the interlayer dielectric 86).

Therefore, the characteristics of a magnetic memory including a magnetoresistive effect element according to the first or second embodiment can be improved.

[Others]

In the above embodiments, a magnetoresistive effect element in a bottom free structure (top pin structure) in which a storage layer is provided below a reference layer is shown. In a magnetoresistive effect element in a top free structure (bottom pin structure) in which a storage layer is provided above a reference layer, an insertion film may be provided between a MgO film and the storage layer. However, in a magnetoresistive effect element in the top free structure, the insertion film (for example, a Nb film) is inserted between the MgO film on the upper side (upper electrode side) and the storage layer. The top surface of the storage layer is in direct contact with the insertion film. The bottom of the storage layer is in contact with the top surface of the MgO film (MgO film on the lower side) as a tunnel barrier film.

Also in a magnetoresistive effect element in the top free structure, the insertion film may be provided between the reference layer and the foundation MgO film.

A magnetic memory using a magnetoresistive effect element according to an embodiment is used as an alternative memory to, for example, a DRAM, SRAM or the like. A magnetic memory using a magnetoresistive effect element according to an embodiment is used as a cache memory of a storage device like, for example, a SSD (Solid State Drive).

A magnetoresistive effect element according to an embodiment may be applied to memories other than RAM.

A magnetoresistive effect element according to an embodiment may be used for magnetic devices (for example, a magnetic head of HDD) other than memories.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
   a substrate;
   a pinned layer above the substrate;
   a free layer between the substrate and the pinned layer;
   a non-magnetic layer between the free layer and the pinned layer;
   a first layer on an opposite side of a side of the non-magnetic layer of the free layer, the first layer being between the free layer and the substrate, the first layer including magnesium oxide as a principal component, and the first layer being non-magnetic;
   a second layer formed of one layer selected from the group consisting of a metal layer and a compound layer inserted between the first layer and the free layer, the second layer being in direct contact with the first layer and the free layer, and the second layer being nonmagnetic; and a third layer between the first layer and the substrate, the third layer being in contact with the substrate.

2. The element according to claim 1, wherein a surface smoothness of the second layer is higher than a surface smoothness of the first layer.

3. The element according to claim 1, wherein the metal layer is a layer having at least one element selected from a group consisting of niobium, hafnium, tantalum, ruthenium, and tungsten as the principal component.

4. The element according to claim 1, wherein the compound layer is a layer selected from a group consisting of a titanium nitride layer, a tantalum nitride layer, a lead doped indium oxide layer, and a zinc oxide layer.

5. The element according to claim 1, wherein the compound layer includes a magnesium oxide layer including impurities.

6. The element according to claim 5, wherein the second layer is a layer including a plurality of crystal grains of 5 nm or less and the second layer is a (001)-oriented layer.

7. The element according to claim 1, wherein a thickness of the second layer is 0.5 nm or less.

8. The element according to claim 1, wherein the free layer includes a layer having at least two elements selected from a group including iron, cobalt, and boron as the principal components.

9. The element according to claim 1, wherein the free and pinned layers have perpendicular magnetic anisotropy.

10. The element according to claim 1, wherein a direction of magnetization of the free layer is variable and the direction of the magnetization of the pinned layer is invariable.

11. The element according to claim 1, wherein the nonmagnetic layer is a layer having magnesium oxide as the principal component.

12. A magnetic memory comprising:

a memory cell including the magnetoresistive effect element according to claim 1.

* * * * *